United States Patent [19]
Toriumi et al.

[11] Patent Number: 5,463,234
[45] Date of Patent: Oct. 31, 1995

[54] HIGH-SPEED SEMICONDUCTOR GAIN MEMORY CELL WITH MINIMAL AREA OCCUPANCY

[75] Inventors: Akira Toriumi; Naoyuki Shigyo; Tetsunori Wada; Hiroyoshi Tanimoto; Kazuya Ohuchi, all of Kanagawa; Makoto Yoshimi, Tokyo, all of Japan

[73] Assignee: Kabushiki Kaisha Toshiba, Kawasaki, Japan

[21] Appl. No.: 407,040

[22] Filed: Mar. 17, 1995

Related U.S. Application Data

[63] Continuation of Ser. No. 40,859, Mar. 31, 1993, abandoned.

[30] Foreign Application Priority Data

Mar. 31, 1992 [JP] Japan ................................. 4-077899
Apr. 1, 1992 [JP] Japan ................................. 4-079609
Sep. 18, 1992 [JP] Japan ................................. 4-250134
Feb. 24, 1993 [JP] Japan ................................. 5-035792

[51] Int. Cl.⁶ .......................... H01L 23/48; H01L 27/02
[52] U.S. Cl. ..................... 257/296; 257/300; 257/368; 257/410; 257/622
[58] Field of Search ............................. 257/296, 298, 257/300, 321, 368, 401, 410, 476, 622, 393

*Primary Examiner*—Mark V. Prenty
*Attorney, Agent, or Firm*—Oblon, Spivak, McClelland, Maier & Neustadt

[57] ABSTRACT

A semiconductor memory device, in particular a dynamic random access memory cell which realizes a high speed thereof and presenting a superior controllability. The dynamic random access memory (DRAM) cell includes: a first transistor; a second transistor, electrically connected in series to the first transistor, for storing an electric charge, the second transistor including a portion for erasing the charge stored at the second transistor, wherein the first transistor and the second transistor are electrically connected between a power line and a bit line; and a diode electrically connected between the first transistor and the second transistor. Alternatively, the present invention can be realized with three transistors where the memory cell includes: a first transistor and a second transistor provided between the power line and the bit line in a manner that the first and second transistors are connected in series at a connecting node therebetween; and a third transistor provided between a gate of the first transistor and the connecting node, wherein a gate of the second transistor and a gate of the third transistor are commonly connected to the word line.

16 Claims, 21 Drawing Sheets

HIGH-SPEED SEMICONDUCTOR GAIN MEMORY CELL WITH MINIMAL AREA OCCUPANCY

This application is a continuation of application Ser. No. 08/040,859, filed on Mar. 31, 1993, now abandoned.

BACKGROUND OF THE INVENTION

1. Field of the Invention

The present invention relates to a semiconductor memory device, and particularly relates to a memory cell for a dynamic random access memory (DRAM).

2. Description of the Prior Art

Conventionally, there has been constructed a dynamic random access memory (referred to as DRAM hereinafter) comprising a transistor and a capacitor. Accompanied by a highly densified integration, an area for the capacitor for storing a memory need be further made compact.

However, in accordance with a demand of a noise margin or sensitivity of a sense amplifier, there is certain limit in miniaturization thereof. Thus, the configuration of the capacitor is made three-dimensionally so as to increase a surface area thereof, so that an effective area viewed two-dimensionally can be reduced. This attempt has been made since the emergence of 1–4 mega DRAM.

However, the three dimensional configuration is complicated and a processing technique therefor to realize such configuration is extremely difficult. Then, there is proposed a gain cell in which there is provided a amplifying function in the cell itself. Among such gain cells, there is a memory cell where a gate capacity of a transistor is used for a capacitor serving to store an electric charge, and in order to read the electric charge, a charge level is amplified by providing the charge based on data (the stored charge) from a power supply line. In this gain cell, a large-area capacitor is not necessary and the stored charge is supplied from the power line regardless of the charge stored in the capacitor, so that miniaturization and large capacitance therefor can be realized.

FIG. 1 and FIG. 2 shows circuit diagrams for such DRAM. With reference to FIG. 1, the second MOSFET indicated with M2 is connected to the power line $V_{DD}$, a source of M2 is connected to a drain of the first MOSFET indicated with M1, and the source of M1 is connected to a bit line BL. Furthermore, a gate of M1 is connected to a word line WL, and a switching element S is provided and connected between the gate of M2 and the drain of M1. FIG. 2 shows an example where there is used a Schottky diode as the switching element S shown FIG. 1. It is to be noted that M1 serves as an access transistor and M2 a storage transistor.

Next, the operation of the conventional DRAM shown in FIG. 1 an FIG. 2 will be described in detail.

First of all, when "1" (high potential) is to be written to the gain cell, an electric potential of a word line WL of M1 as a transfer transistor is made "1" (high potential) so as to be rendered conductive, and the gate capacitance of M2 which is charged and the storage transistor is made "1" (high potential) through the Schottky diode D. Thus, "1" is written. In this state, even if M1 is turned off, the charge is stored in the gate capacitance of M2, in other words, the data remains stored since the small current flows in a reverse direction through the Schottky diode D. On the other hand, for read-out, the electric potential of the word line WL of M2 is made "1", and if "1" is stored in M2 the M2 is in a conductive state so that the current flows through from the power line $V_{DD}$ to cause to increase the potential of bit line BL and "1" is read out. Namely, the gate capacitance of M2 is utilized as a storage capacitance and an amplifying operation of M2 is utilized so that an output charge is much greater than the charge stored in the cell.

However, in the above-mentioned highly integrated DRAM, since there is utilized a reverse-direction leak current of the diode, whose controllability is no so reliable, in order to extract the charge (rewriting from "1" state to "0" state), an operation margin of the cell is reduced, thus causing a problem where reliability of write-in data and controllability of write-in time are reduced.

With reference to FIG. 3, a similar disadvantage is presented where there is needed a capacity for storing a predetermined electric charge in the DRAM and thus there must be secured an area for such the capacitor. Therefore, the area required for the capacitor will be an disadvantageous aspect in terms of the miniaturization for the DRAM.

Moreover, when a desirable diode is used as the switching element, there takes much time to pull down the charge from the gate, thus being unable to realize a high-speed DRAM.

SUMMARY OF THE INVENTION

In view of the foregoing problems, the object of the present invention is to provide a semiconductor memory device which realizes a high speed thereof and presenting a superior controllability. Therefore, there is provided a dynamic random access memory (DRAM) cell equipped with a power supply line, a bit line and a word line therein, the memory cell comprising: a first transistor; a second transistor, electrically connected in series to the first transistor, for storing an electric charge, the second transistor including a portion for erasing the charge stored at the second transistor, wherein the first transistor and the second transistor are electrically connected between the power line and the bit line; and a diode electrically connected between the first transistor and the second transistor.

Alternatively, the object of the present invention is realized with three transistors where the memory cell comprises: a first transistor and a second transistor provided between the power line and the bit line in a manner that the first and second transistors are connected in series at a connecting node therebetween; and a third transistor provided between a gate of the first transistor and the connecting node, wherein a gate of the second transistor and a gate of the third transistor are commonly connected to the word line.

Other features and advantages of the present invention will become apparent from the following description taken in conjunction with the accompanying drawings.

BRIEF DESCRIPTION OF THE DRAWINGS

FIG. 16 is deleted and no longer exists.

FIGS. 21a and 21b shows another production method for a process up to FIG. 20a.

FIGS. 22a and 22b show still another production method for a process up to FIG. 20a.

FIG. 23b shows a modified version over the memory cell shown in FIG. 23a.

FIG. 24 shows a cross section of a device structure realizing the circuit shown in FIG. 23a.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

Embodiment No. 1

Figure 4:
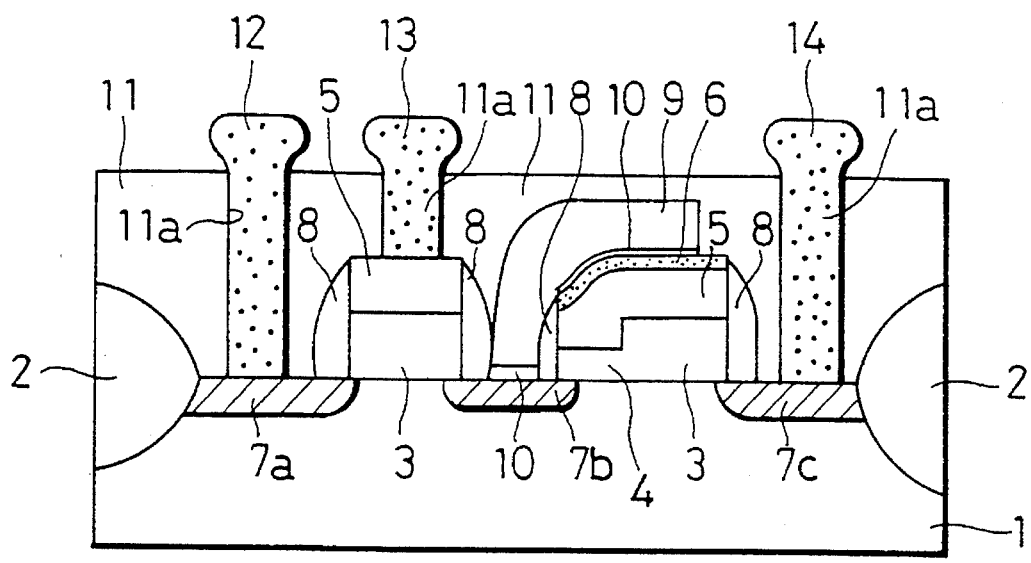
FIG. 4 shows a cross section of DRAM according to the first embodiment of the present invention.

With reference to FIG. 4, a structure of DRAM according to the first embodiment of the present invention will be described in detail.

In the same figure, the reference numeral 1 indicates a p-type silicon substrate. A silicon oxide film 2 is grown on a device isolation area of the p type silicon substrate 1. There is formed a gate oxide film 3 including a gate oxide film 3 of a first MOSFET and a thin oxide film 4 of a second MOSFET on an active area of the p type silicon substrate 1.

Thereafter, a single-crystal silicon film (gate electrode) 5 is formed on the gate oxide film 3 of the first MOSFET, and there is formed a single-crystal silicon film 5, a single-crystal silicon film 6 and a titanium silicide 10, in this order, on the gate oxide film 3 including the thin oxide film 4 of the second MOSFET. There is formed source/drain diffusion layers 7a, 7b, 7c of the first MOSFET on a surface portion of the p type silicon substrate 1 at both sides of the gates of the first and second MOSFETs. The titanium silicide 10 is also formed on the source diffusion layer 7b of the second MOSFET (the drain diffusion layer 7b of the first MOS). The first and second MOSFETs are connected in series to each other. There are formed side walls 8 of silicon oxide film in the gates of the first and second MOSFETs. Furthermore, on the titanium silicide 10 there is formed a titanium film 9 for connecting the single-crystal silicon film 5 to the diffusion layer 7b between the first MOSFET and the second MOSFET. On these constituent elements there is formed an interlayer insulator 11. There are provided a plurality of openings 11a on the source/drain diffusions layer 7a, 7c through the interlayer 11 and the single-crystal silicon film 5. In the openings 11a, there are separately formed a bit line 12, a word line 13 and a power line 14.

Figure 5:
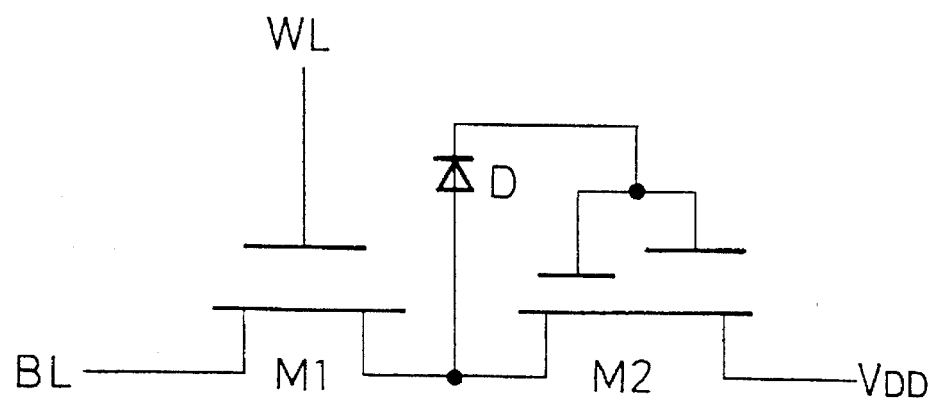
FIG. 5 shows a circuit diagram of the first embodiment shown in FIG. 4.

With reference to FIG. 5, there is shown a circuit diagram of DRAM. In the same figure, a drain of the second MOSFET M2 is connected to a power line $V_{DD}$, and a source of M2 is connected to a drain of the first MOSFET M1. A source of M1 is connected to a bit line BL, and a gate of M1 is connected to a word line WL. There is provided a Schottky diode D connecting a gate of M2 and the drain of M1.

M2 can be considered as two transistors having a commonly shared gate at a source side and a drain side. Since the transistor at the source side has a thin gate oxide film so that there is generated a path through which the current flows between the source and drain.

Therefore, in such a DRAM described above, when "0" is written in while "1" was written, a tunnel current flows between the source and the gate of M2 so that "0" can be written in a short time.

Figure 6A:
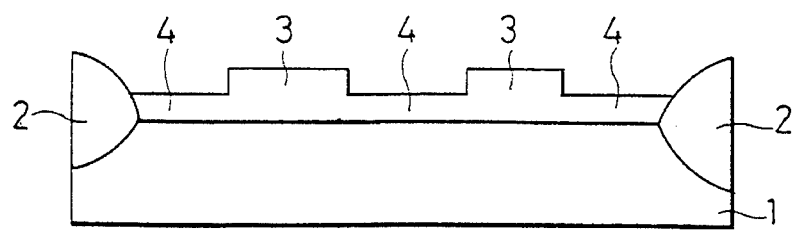
FIGS. 6A through 6D shows a cross sectional view for producing DRAM according to the present invention.

With reference to FIG. 6A, a method for producing the DRAM constructed above will be described in detail.

First of all, on the p type silicon substrate 1 there is formed the silicon oxide film 2 serving as a device isolation. Then, there are formed the first and second MOSFET oxide films 3 on the active area of the p type silicon substrate 1. Thereafter, the gate oxide film 3 is patterned such that there remains a thin oxide film 4. Then, it is preferred that the thickness of the thin oxide film is made in a manner that an electrical field value is greater than 8 MV/cm against a power supply voltage in use.

Figure 6B:
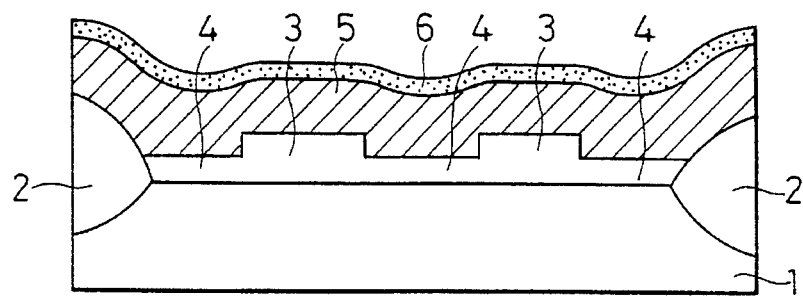

Next, with reference to FIG. 6B, a polysilicon film is deposited on the whole surface by the low-pressure chemical vapor deposition (LPCVD) technique and then the phosphorus is diffused thereinto. Thereafter, there is formed a single-crystal silicon film 5 by thermal annealing or the beam annealing method in a manner that a phosphorus concentration is $10^{20}$ cm$^{-3}$. Thereafter, on the single-crystal silicon film 5 there is epitaxially grown a silicon film 6 where the concentration of n type impurities is approximately $10^{17}$ cm$^{-3}$.

Figure 6C:
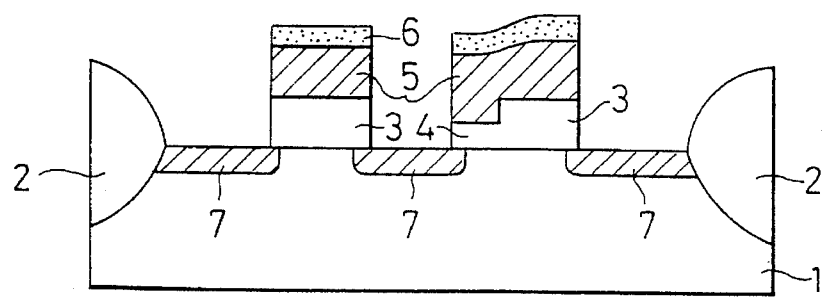

Next, with reference to FIG. 6C, in order to form gates of the first and second MOSFETs, the patterning is performed on the silicon film 6, the single-crystal silicon 5 and the thin oxide film 4, in this order, so that the thin oxide film remains in the gate of the second MOSFET. Thereafter, the arsenic is ion-implanted so that the source/drain diffusion layers 7a, 7b, 7c are self-alignedly formed on the surface region of the p type silicon substrate at both sides of gates of the first and second MOSFET. As a result thereof, the first and second MOSFETs are produced connecting in series therebetween.

Figure 6D:
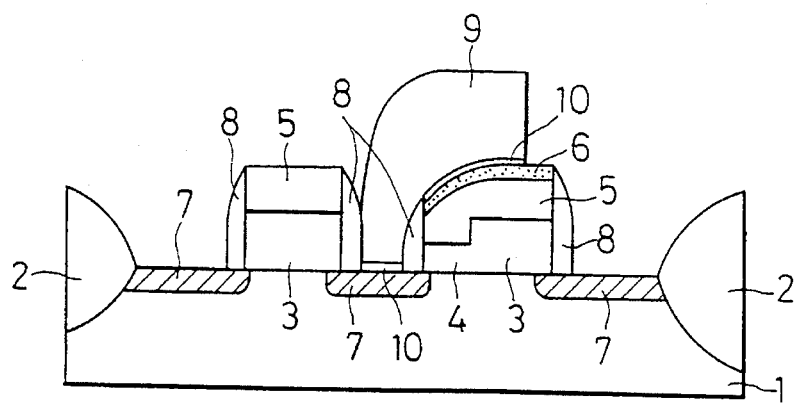

Thereafter, with reference to FIG. 6D, the side wall 8 of the silicon oxide films are formed on gates by a similar procedure to a usual lightly-doped drain (LDD) process, and then the sputtering of titanium is performed over the whole surface. By performing the patterning thereon, the titanium film 9 is formed on the source diffusion layer 7b of the second MOSFET (the drain diffusion layer 7 of the first MOSFET) and the silicon Film 6 of the second MOSFET. Then, by means of a short time annealing, the titanium silicide 10 is formed in an interface of the titanium film 9, the source/drain diffusion layer 7b and the silicon film 6, so as to obtain highly qualified Schottky interfacial property so that an ideal diode characteristic can be obtained. Accordingly, the source of the second MOSFET or the drain of the first MOSFET is connected to the gate electrode of the second MOSFET via the titanium film 9.

Thereafter, with reference to FIG. 4, the interlayer layer 11 is deposited onto the whole surface. Then, by performing the patterning thereon, openings 11a for contacting the drains of the first and second MOSFETs are formed on the source/drain diffusion layers 7 and the single-crystal silicon film 5, respectively. Thereafter, aluminum is deposited on the whole surface by the sputtering. Then, the patterning is effected thereon so as to separately form the bit line 12, the word line 13 and the power line 14 so that a desired memory cell can be completed.

Embodiment No. 2

With reference to FIGS. 7A through 7D, the second embodiment for producing DRAM is described. In the second embodiment, instead of utilizing oxide films of different thickness for the gate insulators for the second MOSFET, there is used an insulator whose barrier height is relatively low.

Figure 7A:
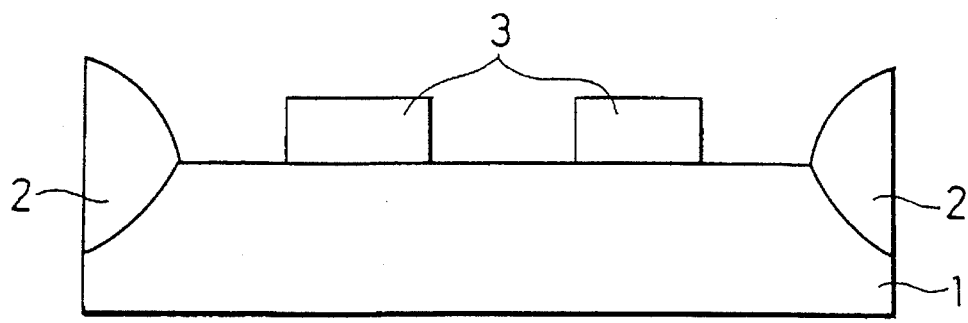
FIGS. 7A through 7D shows another cross sectional view for producing DRAM according to the present invention.

With reference to FIG. 7A, first of all, after there is formed the silicon oxide film 2 serving to isolate the device, on the p type silicon substrate, the gate oxide films of the first and second MOSFETs are formed on the p type silicon substrate 1 by thermal oxidation. The patterning is carried out thereon so as to form a silicon oxide island 3.

Figure 7B:
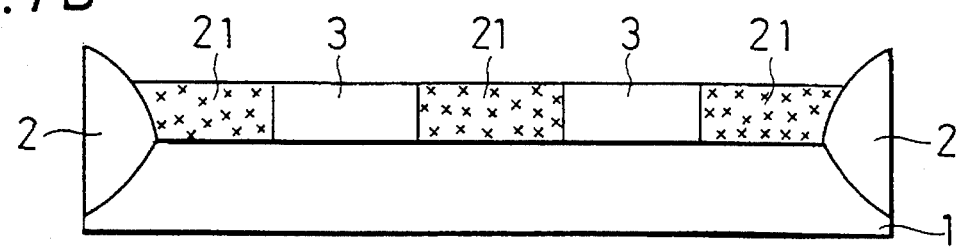

Thereafter, with reference to FIG. 7B, a silicon nitride film is deposited on the whole surface by the low-pressure chemical vapor deposition (LPCVD) so as to be etchbacked. As a result, there is obtained an area in which the silicon nitride film 21 and the silicon oxide film 3 are arranged alternately.

Figure 7C:
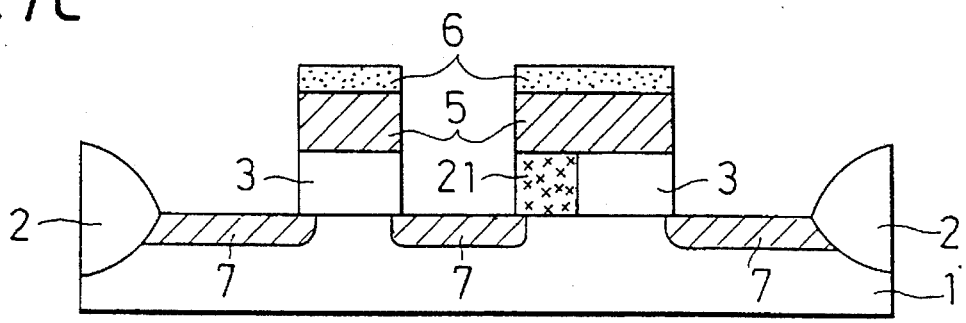

Next, with reference to FIG. 7C, a polysilicon film is deposited on the whole surface by the low-pressure chemical vapor deposition (LPCVD) technique and then the phosphorus is diffused thereinto. Thereafter, there is formed the single-crystal silicon film 5 by annealing or the beam annealing method in a manner that the phosphorus concentration is $10^{20}$ cm$^{-3}$. Thereafter, on the single-crystal silicon film 5 there is epitaxially grown the silicon film 6 in a manner that the concentration of n type impurities is approximately $10^{17}$ cm$^{-3}$. Thereafter, in order to form gates of the first and second MOSFETs, the patterning is performed on the single-crystal silicon film 6, a single-crystallized silicon film 5 and the silicon nitride film 21, in this order, so that the silicon nitride film 21 remains in the gate of the second MOSFET. Thereafter, the arsenic is ion-implanted so that the source/drain diffusion layer 7 is self-alignedly formed on the surface region of the p type silicon substrate at both sides of gates of the first and second MOSFETs.

Figure 7D:
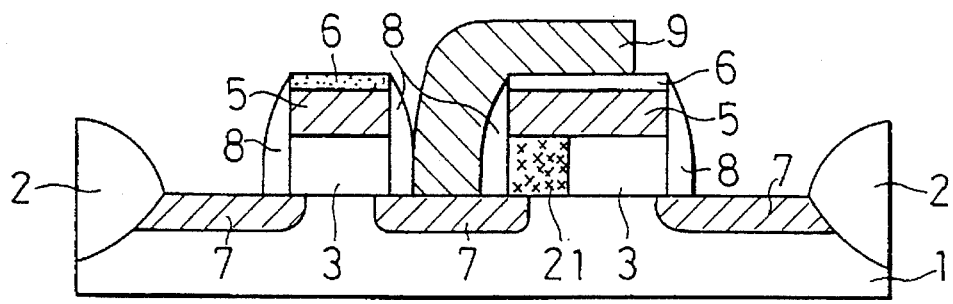

Thereafter, with reference to FIG. 7D, the side wall 8 of the silicon oxide films are formed on gates by a similar procedure to the usual lightly-doped drain (LDD) process, and then the sputtering of titanium is performed over the whole surface. By performing the patterning thereon, the titanium film 9 is formed on the source diffusion layer 7b of the second MOSFET (the drain diffusion layer of the first MOSFET) and the silicon film 6 of the second MOSFET.

It is to be noted here that a barrier height of a tunnel current is lower than other portion of insulating portion.

Though there is used the p type substrate for the above first and second embodiments, an n type substrate may be used. When the n type substrate is used, a process according to the process implemented in the p type substrate may be utilized. Besides the titanium or titanium silicide used for the Schottky electrode, there may be used other metal or metal silicide having different work function according to a supply voltage. Moreover, besides the Schottky diode used in the above embodiments, there may be used a diode utilizing a p-n junction structure. When the p-n junction type diode is used, a production process for the device can be carried out with ease if a selective epitaxial technology is utilized while impurity is being doped.

Accordingly, since the tunnel current flows through between the gate and source of the second MOSFET, a highly integrated and high-speed device can be realized. Moreover, since the diode having the ideal characteristics can be thus formed, the reliability of write-in data and the controllability of write-in time can be significantly improved, thus reducing irregularity of the device.

Embodiment No. 3

It is to be noted hereinafter that the terms M1, M2 are interchangeably used throughout the specifications, Moreover, the second transistor M2 is connected to $V_{DD}$ in the first and second embodiment, whereas the first transistor M1 is connected to $V_{DD}$ in the third through seventh embodiments.

Figure 8:
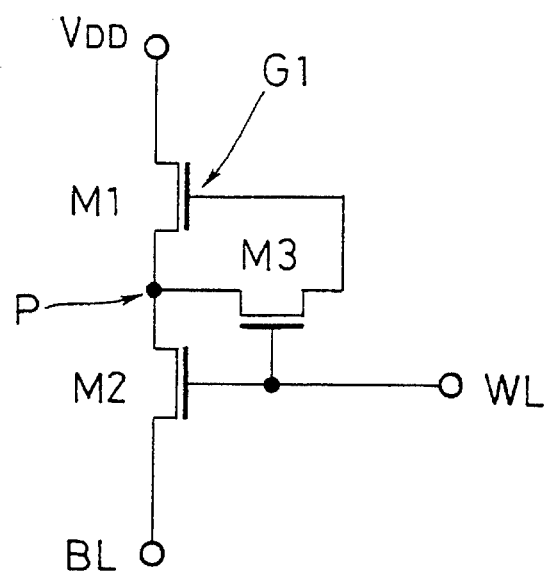
FIG. 8 shows an equivalent circuit for the memory cell according to the third embodiment of the present invention.

With reference to FIG. 8, there is shown an equivalent circuit for the DRAM memory cell according to the third embodiment. In the figure, the first MOS transistor M1 and the second MOS transistor M2 are connected in series between the power supply line $V_{DD}$ and the bit line BL. The first MOS transistor M1 is configured such that a gate G1 serves as a storage node and the second MOS transistor servers as a transfer gate transistor. There is provided a third MOS transistor M3 between a connecting node P of the first and second transistors M1, M2 and the gate G1 of the first MOS transistor. The gate of the second MOS transistor M2 and the gate of the third MOS transistor are commonly connected to the word line WL. Here, when a threshold voltage of the second MOS transistor M2 is defined as $V_{th2}$ and a threshold voltage of the third MOS transistor as $V_{th3}$, relationship therebetween is set such that, $$|V_{th2}|<|V_{th3}|$$

Next, an operational principle of the memory call thus constructed will be described in detail.

In the course of explanation therefor, assume that all MOS transistors M1–M3 are of an n channel type, and a positive power supply is used for the power supply line $V_{DD}$. Moreover, the threshold voltages $V_{th2}$, $V_{th3}$ of the second MOS transistor and the third transistor are positive. If all MOS transistors M1–M3 are of a p channel type, potential relationship therefor will be opposite to the case above.

When writing data "1", an "H" (high) level potential is applied to the bit line, and the word line WL is supplied with a write-in potential $V_w$ which is greater than the threshold voltages $V_{th2}$, $V_{th3}$ of the second and third MOS transistors M2, M3. Thereby, both the second and third MOS transistors M2, M3 are rendered conductive. As a result thereof, the gate G1 of the first MOS transistor M1 is charged up from the bit line BL through the second and third MOS transistors M2, M3, so that the first MOS transistor M1 is rendered conductive.

On the other hand, when writing data "0", the bit line BL is set to a "L" (low potential) level and the write-in voltage $V_w$ is applied to the word line WL. The write-in voltage $V_w$ is set to a value which is greater than the threshold voltage $V_{th3}$ and $V_{th2}$. Thereby, the gate G1 of the first MOS transistor M1 remains intact at "L" if a previous data is "0". If the previous data is "1", the charge of the gate G1 is discharged to the bit line BL so as to be "L" level, so that the first MOS transistor is rendered nonconductive, that is, turned to an off state, with data being "0".

When reading out the data, for example, the bit line BL is precharged to a predetermined potential which is lower than that of the power supply. Then, while keeping the bit line BL in a floating state, a read-out potential $V_R$ is applied to the word line WL. The read-out potential $V_R$ is set such that $V_R$ is greater than the threshold voltage $V_{th2}$ of the second MOS transistor and is smaller than the threshold voltage $V_{th3}$ of the third transistor.

When data is "1", the first transistor M1 is in the state of being conductive. The current flows from the power line $V_{DD}$ to the bit line BL through the first transistor M1 and the second transistor M2 which is rendered conductive by the read-out potential $V_R$. Then, the sense amplifier detects an potential fluctuation of the bit line BL, so that "1" is read out. On the other hand, when data is "0", the first transistor M2 is in the state of being nonconductive. Therefore, the potential fluctuation is in the opposite direction to that of the previous case. While such read-out operation of the data, the third MOS transistor remains nonconductive so that data will not be destroyed.

The precharge potential for the bit line BL may be an intermediate level between the "H" level and the "L" level or may be the "L" level (0 V). In the former case of the intermediate level, the existence of the fluctuation of the bit line potential due to the difference of the power supply potential and the precharge potential is judged as the difference of data "0" and "1". In the latter case of the precharge potential being the "L" level, the difference in the fluctuation of the bit line potential between the data "0" and "1" is relatively large so that the read out of the data is executed more distinctly. In the memory cell shown in FIG. 8, the power line $V_{DD}$ and the bit line BL may be connected other way around.

Figure 9:
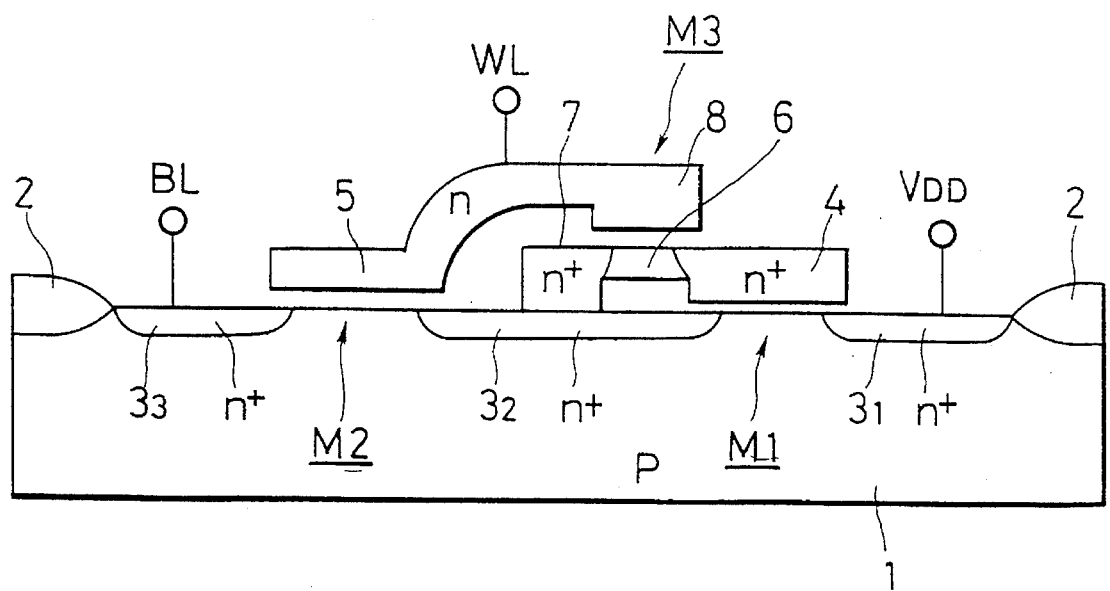
FIG. 9 shows a structural example of a specific memory cell according to the third embodiment.

With reference to FIG. 9, there is shown a structural example of a specific memory cell according to the third embodiment.

In FIG. 9, in a region enclosed by an device isolating insulator of a p type silicon substrate 1 there are formed $n^+$ layers $3_1, 3_2, 3_3$ which become a source and a drain. The first MOS transistor M1 comprises the $n^+$ type layers $3_1, 3_2$ and a gate electrode formed on the substrate therebetween. The second MOS transistor M2 comprises the $n^+$ type layers $3_2$, $3_3$ and a gate electrode 5 formed on the substrate therebetween. On the $n^+$ type layer $3_2$ there is formed an insulator-isolated p type polysilicon film 6 continuously from the gate electrode 4. At an opposite side of the electrode 4, an $n^+$ type layer 7 is formed continuously from the p type polysilicon film 6. On the p type poly silicon film 6 there is formed a gate electrode 8 so as to construct the third MOS transistor M3. The gate electrode 8 of the third MOS transistor and the gate electrode 5 of the second MOS transistor M2 are commonly connected to the word line WL.

In this memory cell structure, there are three MOS transistors, one of which is configured and deposited in a vertical direction. Therefore, the memory cell array can be integrated with a small occupancy thereof in the cell.

With reference to FIGS. 10a–10d and FIGS. 11a–11c, there are shown cross sectional views for producing a memory cell shown in FIG. 9.

Figure 10A:
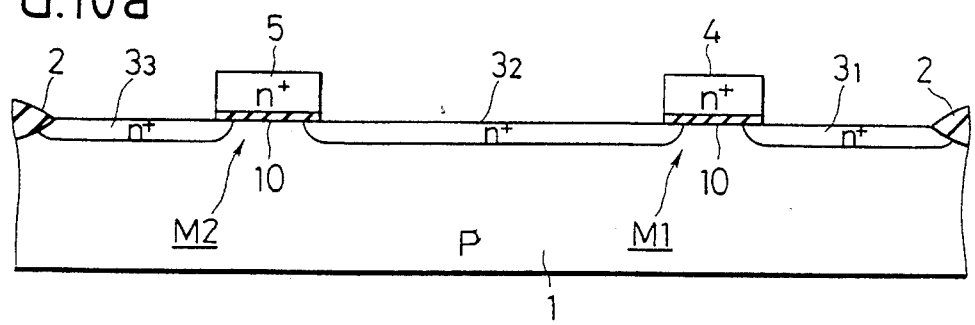
FIGS. 10a–10d and FIGS. 11a–11c show cross sectional views for producing a memory cell shown in FIG. 9.

With reference to FIG. 10a, after a gate oxide 10 of 15 nm is formed in the area enclosed by the device isolating insulator 2, the gate electrodes 4, 5 of the n type polysilicon film are formed by a polysilicon deposition and a lithography technique. Thereafter, using the gates electrodes 4, 5 as a mask, an ion implantation is carried out and the $n^+$ layers $3_1$ through $3_3$ serving as the source and drain so as to obtain the first and second MOS transistors M1, M2.

Figure 10B:
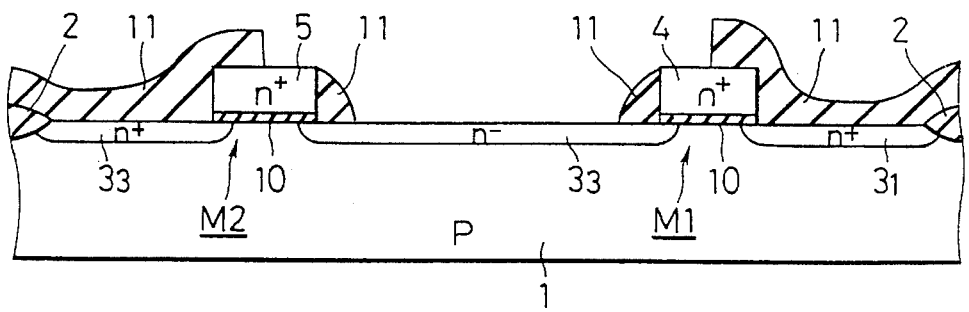

Thereafter, with reference to FIG. 10b, a silicon oxide 11 of 400–600 nm is deposited by a chemical vapor deposition (CVD). The silicon oxide 11 remains at both sides of the cell, whereas the silicon oxide at a central portion is removed by the lithography and etching methods. The etching process is terminated at a point when the surfaces of the gate electrodes 4, 5 and $n^+$ type layer $3_2$ are exposed, so that there remains the silicon oxide 11 at sidewalls of the gate electrodes 4, 5.

Figure 10C:
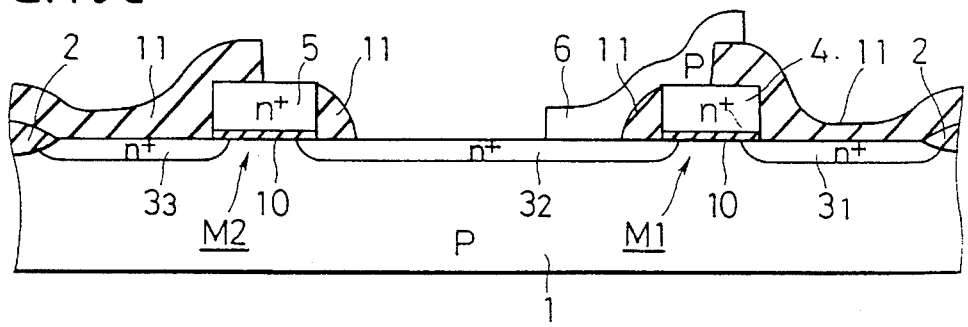

Thereafter, with reference to FIG. 10c, a p type polysilicon film 6 is deposited by the CVD process, then patterning is performed thereon by the lithography and a reactive ion etching (RIE) method, so that the p type polysilicon film 6 is formed in a manner that the film 6 is extended over the $n^+$ type layer $3_2$ and the the gate electrode 4 of the first MOS transistor M1. Then, the thickness of the p type poly silicon film 6 is 400–600 nm, for example, and a boron concentration is $1.5 \times 10^{17}/cm^3$.

Figure 10D:
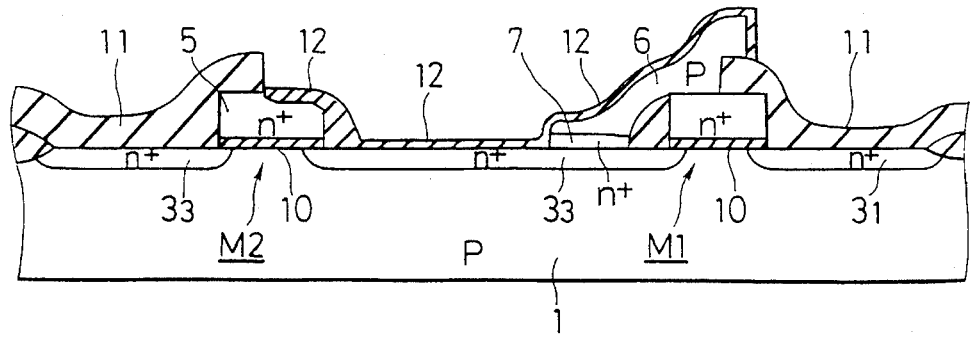

Next, with reference to FIG. 10d, an oxide film 12 of approximately 37 nm is formed on the surface of the p type polysilicon film 6 by a thermal oxidation process so as to be a gate oxide film. At the same time, the oxide film 12 is formed on the surfaces of the $n^+$ type layer $3_2$ and the gate electrode 5. In this thermal oxidation process, an $n^+$ type layer 7 is also formed on a portion of the p type polysilicon film 6 which is in contact with the $n^+$ layer $3_2$, by an impurity diffusion from the $n^+$ type layer $3_2$.

Figure 11A:
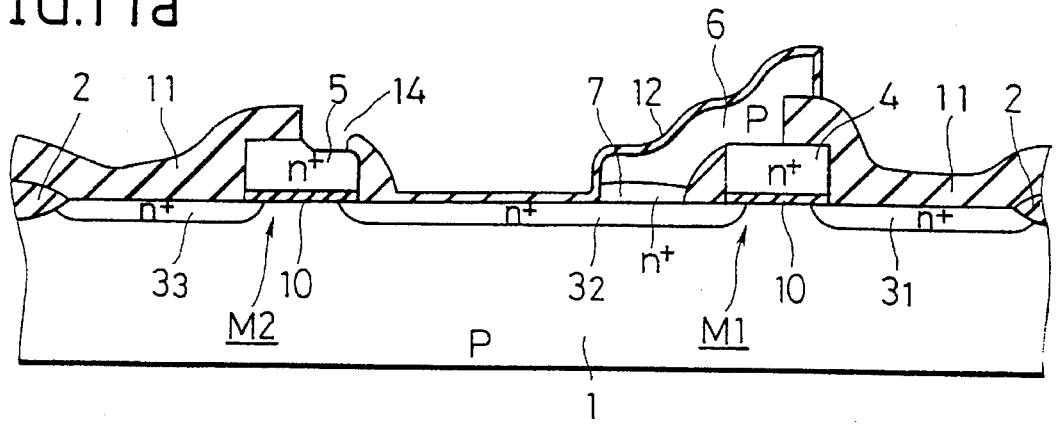

Thereafter, with reference to FIG. 11a, an opening 14 is formed on the $n^+$ layer 32 and the gate electrode 5 by the lithography and the etching on the oxide.

Figure 11B:
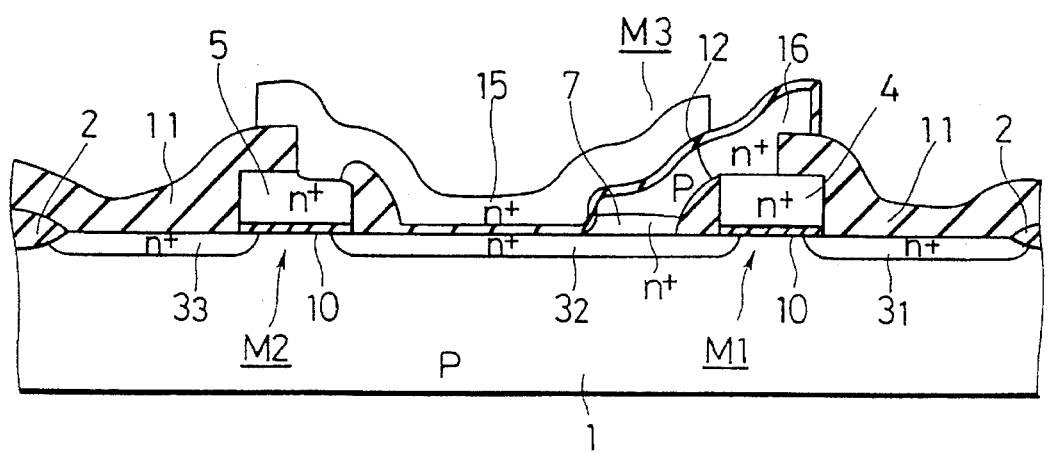

Thereafter, with reference to FIG. 11b, the polysilicon film 15 is deposited again and the patterning is performed by the lithography and the etching so that the polysilicon film 15 is formed over the p type polysilicon film 16 and the gate electrode 5. Then, the ion implantation by an arsenic or the like is carried out over the whole surface thereof so that the polysilicon film 15 becomes $n^+$ type and an end portion of the p type polysilicon film 6 which is not covered with the polysilicon film 15 becomes the $n^+$ type layer 16. Thereby, the third MOS transistor M3 is formed where the p type polysilicon film 6 serves as an active layer and the n⁺ type polysilicon film 15 serves as the gate electrode.

The gate electrode of the third MOS transistor M3 comprising the n⁺ polysilicon film 15 is connected to the gate electrode 5 of the second MOS transistor M2. Moreover, the n⁺ type layer 16 of the third MOS transistor M3 is connected to the gate electrode 4 of the first MOS transistor M1.

Figure 11C:
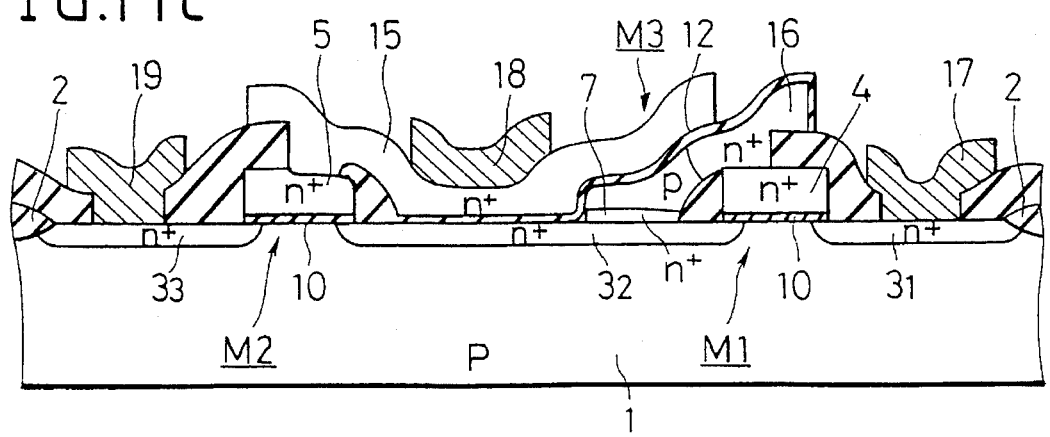

Finally, with reference to FIG. 11c, there is formed a contact hole therein. By the sputtering and patterning of Al (aluminum) film, there are formed Al interconnections 17, 18, 19 which become the power line $V_{DD}$, the word line WL and the bit line BL, respectively.

Figure 12:
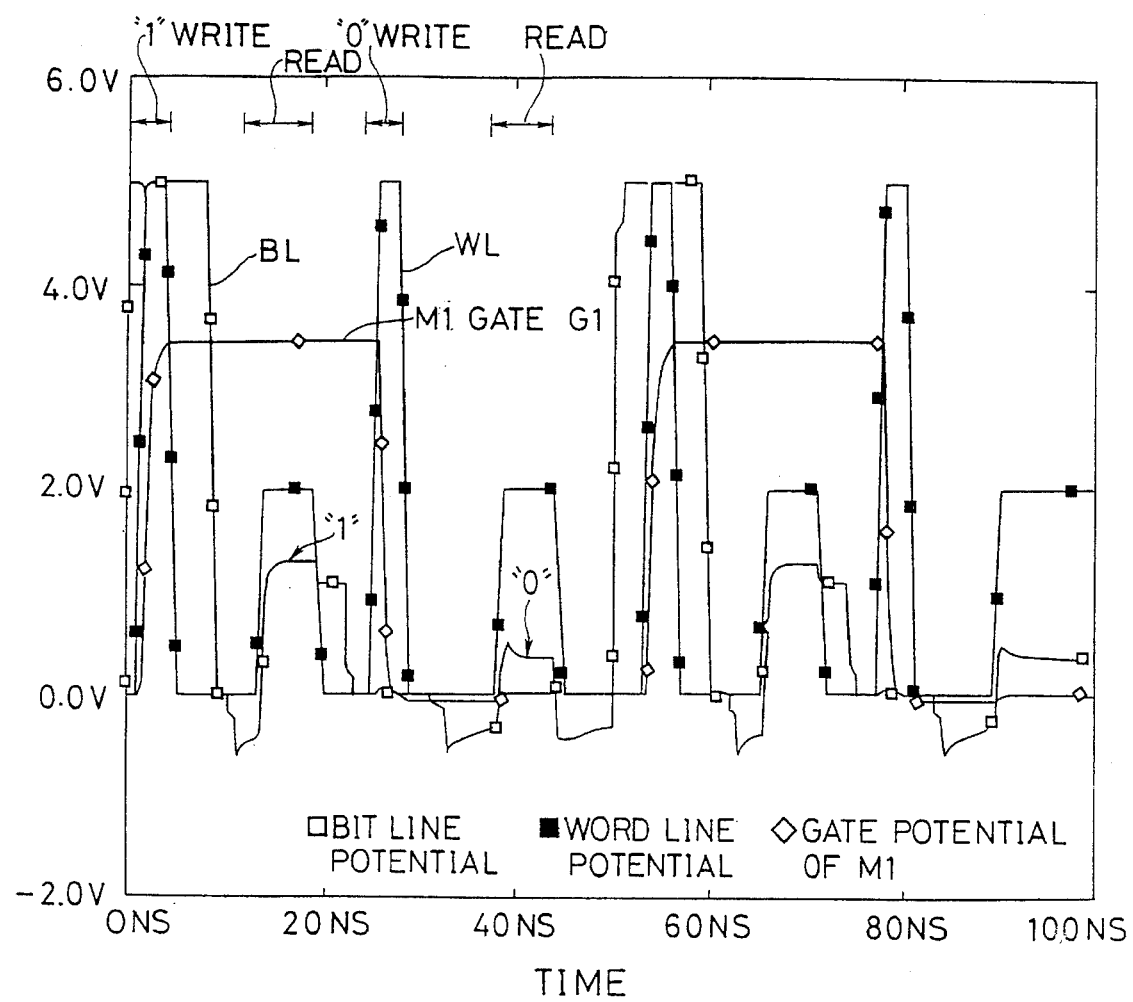
FIG. 12 is a graph showing an analytical result of the operation of the memory cell according to the third embodiment.

FIG. 12 shows a circuit-simulation analytical result of the operation of the memory cell according to the third embodiment.

In the same figure, a horizontal axis shows a lapse of time while a vertical axis shows a bias of the word line WL, the bit line BL and the gate G1 of the first MOS transistor M1. Power supply potential is $V_{DD}$=5 V. In order to write data "1", the bit line potential is increased to 5 V at time zero, and after 2 n seconds the gate G1 of the first MOS transistor M1 is increased to 3.3 V through the second and third MOS transistors M2, M3. The potential of the gate G1 is held intact until 27 n sec. when "0" is next written in.

In order to read out the data, the bit line bias is set to 0 V at 10 n second and, after the 10 n second, the bit line is in a floating state. Then, the word line potential is increased to 2 V at 14 n sec. This potential turns the second MOS transistor M2 in a conductive state, however, the word line bias should be lower than the threshold voltage at M3. Then, the first MOS transistor M1 is in the state of being conductive by data "1" and the bit line BL is connected to the power line through the first and second MOS transistors, so that the first MOS transistor M1 is increased to 1.2 V immediately.

Next, in order to write in data "0", the word line potential is pulled down at 20 n sec. and the gate G1 is electrically isolated from the bit line BL. Thereafter, the bit line bias is set to 0 V, and the the word line bias is increased to 5 V at 26 n se. Thereby, the positive charge stored at the gate G1 of the first MOS transistor is discharged to the bit line BL through the second and third transistors M2, M3.

Thereafter, in order to read out the data again, after the bit line bias is set to 0 V so as to be in the state of floating, the word line bias is increased to 2 V. Then, though the bit line bias is increased to approximately 0.4 V due to a capacitive coupling with the word line WL, this operation of reading out data can be easily distinguished from the potential when the previous reading of "1".

In the same figure of FIG. 12, there are shown bias waveforms of each portion when the data read/write operation is repeatedly executed up to 100 n sec. According to the figure, the data is written in regardless of the previous data written, and is read out anew.

In the third embodiment above, two MOS transistors are placed on the flat plane and another MOS transistor is arranged thereabove. It shall be appreciated that configuration therefor may be varied. For example, a groove is formed on the substrate and MOS transistors may be formed inside or in the sidewalls of the groove, so that the memory cell can be integrated into a small occupied area.

Embodiment No. 4

Figure 13:
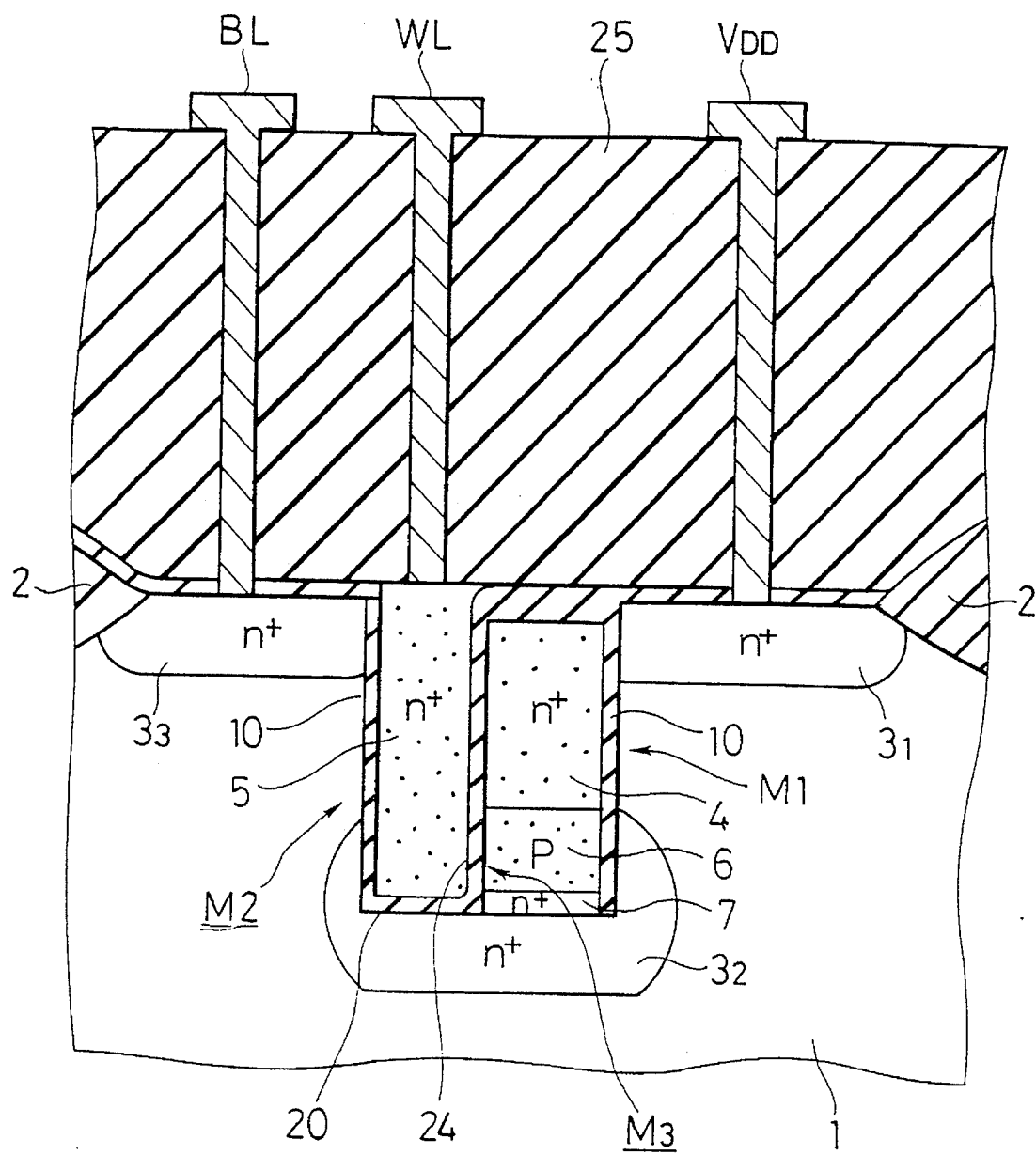
FIG. 13 shows a cross sectional structure of a DRAM memory cell according to the fourth embodiment.

With reference to FIG. 13, there is shown a cross sectional view of a DRAM memory fell according to the fourth embodiment.

In the fourth embodiment, there is provided a groove in the substrate so that the memory fell shown in the equivalent circuit shown in FIG. 8 can be further integrated compactly. The portions corresponding to the same parts shown in FIG. 9 are given identical reference numerals.

In FIG. 13, there is provided the groove 20 in a region enclosed by the device isolating insulator 2 of the p type silicon substrate. Utilizing tow sidewalls of the groove 20, there are formed the first and second MOS transistors M1, M2 therein. There is formed the third MOS transistor M8 below the first MOS transistor M1.

In other words, the n⁺ type layer $3_2$ is formed in a base portion of the groove 20, the n⁺ type layer $3_3$ is formed in a left flat side thereof which is in contact with the groove, the gate oxide film 10 is formed in a left sidewall of the groove, and the gate electrode of the n⁺ type polysilicon 5 is filled into the left side of the groove, so as to form a vertical type MOS transistor M2. Moreover, the gate oxide film 10 is formed in a right sidewall, and the n⁺ type layer $3_1$ is formed in a right flat side thereof which is in contact with the groove. There is formed the n⁺ type layer 7 which is in contact with the base portion of the right half portion of the groove 20. On the n⁺ type layer 7 there is formed the p type polysilicon 6 on which there is filled the n⁺ type polysilicon 4. Accordingly, in the right sidewall of the groove 20 there is constructed a vertical type MOS transistor M1 whose gate electrode is the n⁺ type polysilicon 4. Furthermore, there is formed the gate oxide film 24 in the sidewall of the p type polysilicon film 6 serving as an active layer, so that there is constructed a vertical type MOS transistor M3 whose gate electrode is the n+ type polysilicon film 5.

With reference to FIGS. 14a, 14b and 15a, 15b, there is shown a cross sectional view for producing the memory cell according to the fourth embodiment.

Figure 14A:
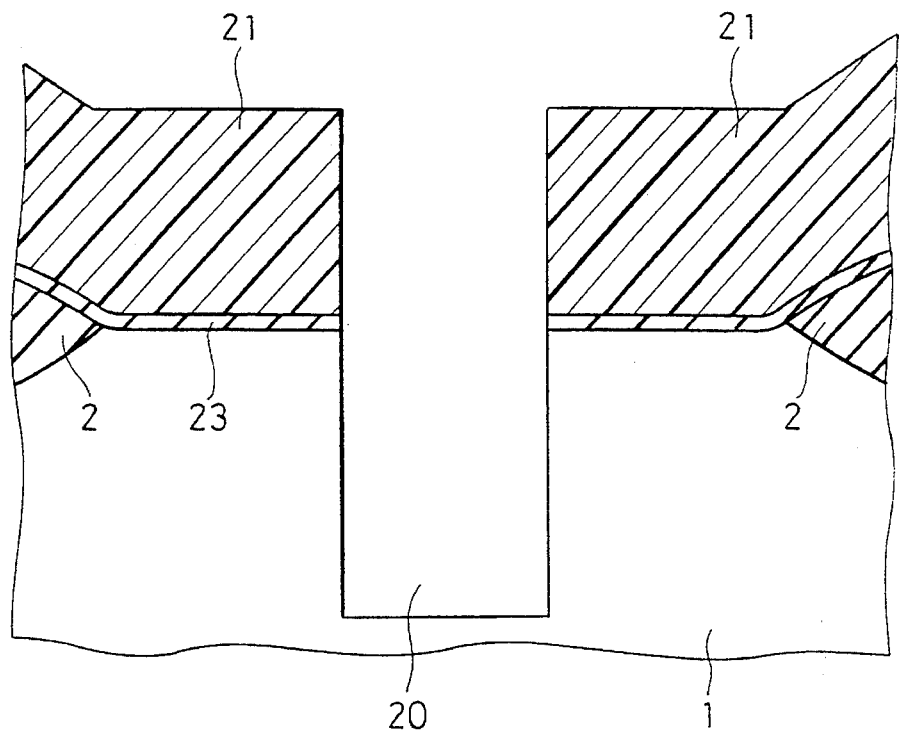
FIGS. 14a, 14b and 15a, 15b show a cross sectional view for producing the memory cell according to the fourth embodiment.
Figure 14B:
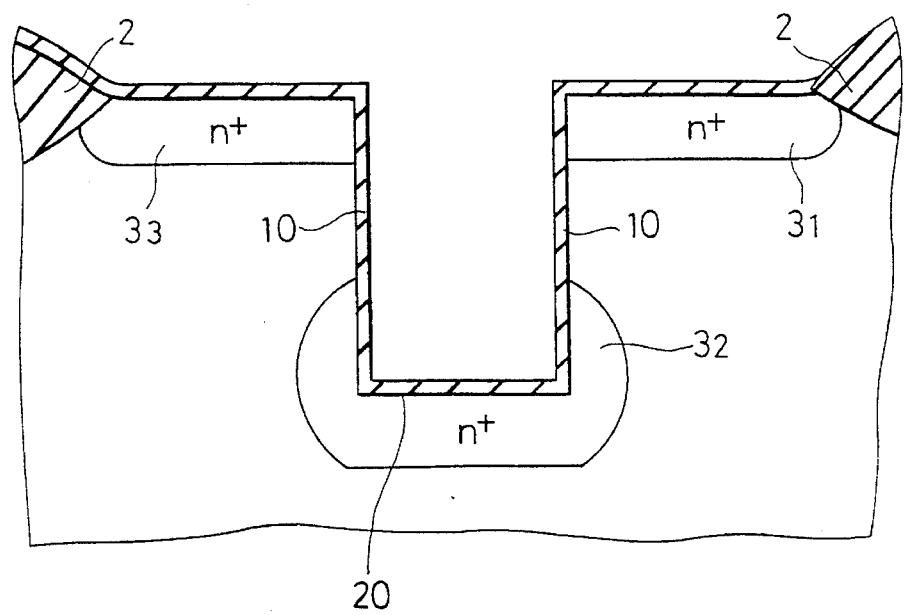

With reference to FIG. 14a, first of all, there is formed a thermal oxide film for a protection purpose with a thickness of approximately 100 nm in a region enclosed by the device isolating insulator 2 of the p type silicon substrate 1. Thereafter, a resist pattern 21 is formed by the lithography process, and the substrate 1 is etched by the RIE method so as to form the groove 20. Thereafter, with reference to FIG. 14b, the resist is removed and the thermal oxide film is formed on the whole surface of the substrate. Thereafter, the arsenic is ion-planted on the whole surface thereof so that the n⁺ type layers $3_1$, $3_3$ are formed in the flat surfaces in contact with the groove. At the same time thereof, there is formed the n⁺ type layer $3_2$ on the base portion of the groove 20. Thereafter, the thermal oxide film is removed, then the thermal oxidation is performed again so as to form a thermal oxide film 10 anew in the sidewalls of the groove 20, the newly formed thermal oxide film serving as the gate insulator.

Figure 15A:
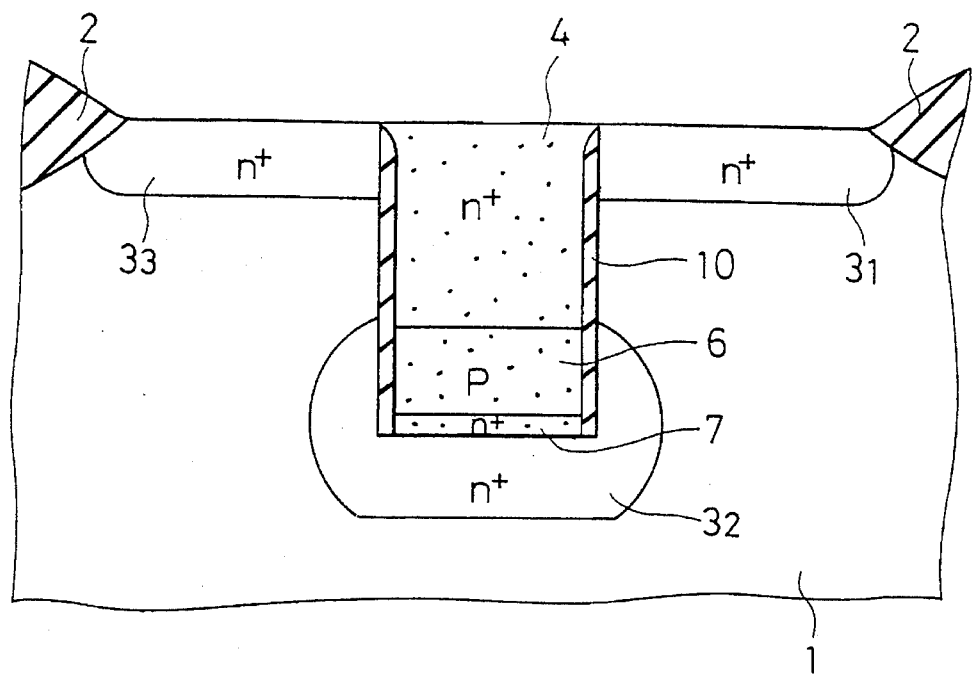

Next, with reference to FIG. 15a, the polysilicon n⁺ type layer 7, p type layer 6 and n⁺ type layer 4 are deposited in this order by the CVD method so that those layers are filled into the groove. The top end of the p type layer 6 is preferably constructed such that the height thereof is same with or higher than the top end of the n⁺ type layer $3_2$. It shall be appreciated that the filling of the groove 20 may be achieved by an epitaxial growth in place of the CVD method, or the n⁺ type layer 7 may be formed by an impurity diffusion from the n⁺ type layer $3_2$ after the filling of the p type layer 6 and the n⁺ type layer 4. The n⁺ type layer 7 that is a lowest layer is connected to the n⁺ type layer $3_2$ which is already formed in the base of the groove 20.

By the above process, there are formed the first and second MOS transistors M1. M2 in the both sidewalls of the groove 20. It is preferred that the impurity concentration of the p type layer 6 is higher than that of the p type silicon substrate.

Figure 15B:
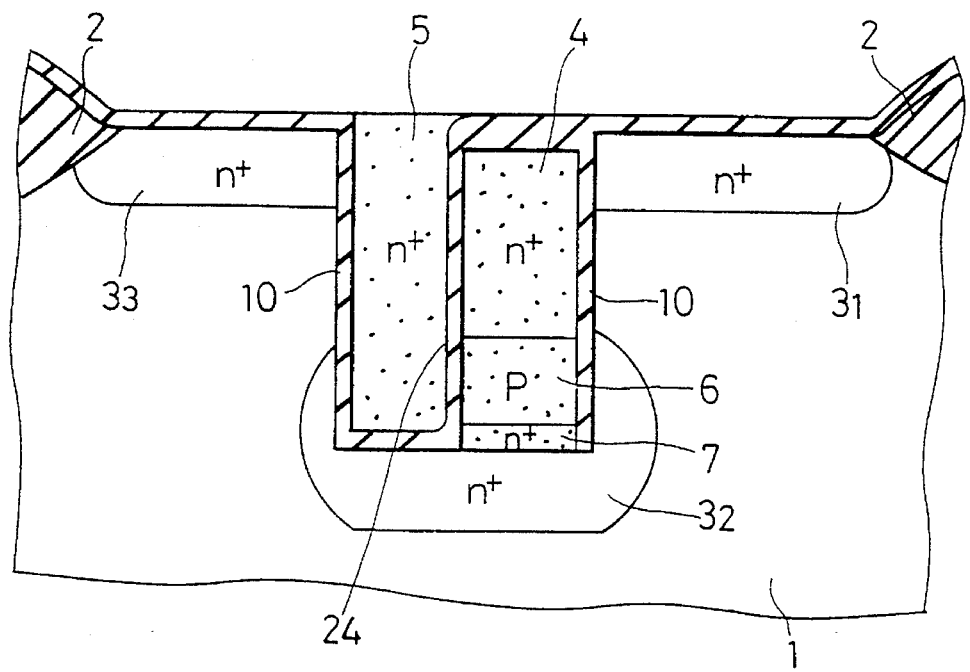

Thereafter, with reference to FIG. 15b, the n⁺ type layer 4, the p type layer 6 and the n⁺ type layer 7 are removed by the lithography and RIE techniques in a manner that the right half side of the n⁺ type layer 4, the p type layer 6 and the n⁺ type layer 7 remain intact. Then, after there is formed the thermal oxide film 24 which will serve as the gate insulator inside the groove, the n⁺ type layer 5 made of the polysilicon is filled again into the groove 20. Thereby, there is formed the third MOS transistor M3 in which the p type layer 6 serves as an active layer, the n⁺ type layer 4 above the p type layer 6 serves as the source and the n⁺ type layer 7 below the n+ type layer 6 serves as a drain for M3.

When the p type layer 6 is formed with the polysilicon as mentioned above, setting of the threshold relationship between the first and second MOS transistors M1, M2 and the third MOS transistor M3 can be made with ease. Namely, an oxidation rate of the polysilicon is greater than that of the single-crystal silicon. Thereby, when the gate oxide film 10, formed on the sidewall of the groove, of the first and second MOS transistors M1, M2 is formed under the same condition with the gate oxide film 24, formed on the sidewall of the p type layer 6, of the third MOS transistor M3, the latter gate oxide film 24 is thicker than the former oxide film 10. As a result thereof, the threshold voltage of the third MOS transistor M3 becomes higher than that of the first and second MOS transistor M1, M2.

With reference to FIG. 13, finally, there is formed the interlayer insulator 25 and a contact hole is formed therein so that there are formed the bit line BL, the word line WL and the power line $V_{DD}$ by an Al evaporation and the patterning.

In this fourth embodiment, there is formed a memory cell which can be integrated with further small occupied area compared with the third embodiment.

In the above embodiment, the threshold voltage of the third MOS transistor M3 which is used for storing and writing the data is set to a higher value than that of the second MOS transistor M2 used for reading out and writing in the data. Moreover, when the a read-out potential is applied to the word line WL, the second MOS transistor M2 alone is switched ON. Then, the second and third MOS transistors M2, M3 are simultaneously switched ON by supplying the write-in potential which is higher than the read-out potential. It is to be noted that the embodiment described herewith is not limited to the above setting. The threshold voltage of the third MOS transistor M3 may be set equal to that of the second MOS transistor M2 so that other control means can realize the similar memory cell operation.

Embodiment No. 5

Figure 17:
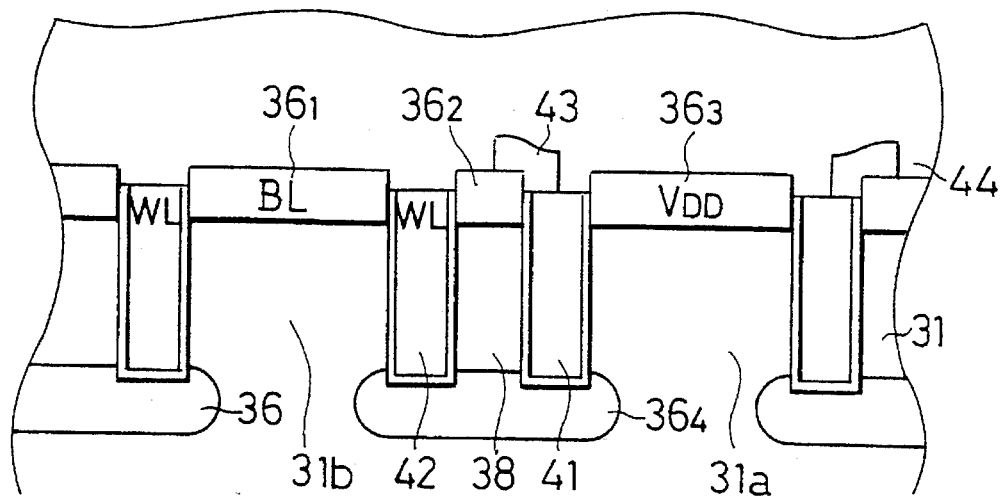
FIG. 17 is a cross sectional view showing a device structure of a DRAM memory cell according to the fifth embodiment.
Figure 18:
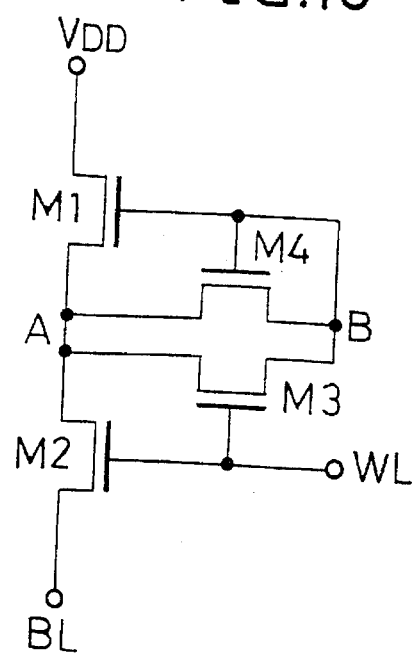
FIG. 18 shows an equivalent circuit for the memory cell shown in FIG. 17.

FIG. 17 is a cross sectional view showing a device structure of a DRAM memory cell according to the fifth embodiment. FIG. 18 shows an equivalent circuit for the memory cell shown in FIG. 17. BL, WL and $V_{DD}$ shown in FIG. 17 correspond to BL, WL and $V_{DD}$ shown in FIG. 18, respectively. An impurity region indicated with $36_4$ shown in FIG. 17 corresponds to a portion marked with A in FIG. 18. $36_2$ of FIG. 17 corresponds to a portion marked with B in FIG. 18. The impurity regions 31a, 31b shown in FIG. 17 correspond to channel regions of the first and second MOS transistors M1, M2 in FIG. 18, respectively. The impurity region 38 shown in FIG. 17 correspond to the channel regions of the third and fourth MOS transistors M4.

With reference to FIG. 18, an operational principle for the memory cell according to the fifth embodiment will be described in detail.

Basically, the operation thereof is same with the memory cell shown in FIG. 8 of the third embodiment. In this fifth embodiment there is additionally provided a fourth MOS transistor M4. Assume hereinafter that all MOS transistors shown in FIG. 18 are n channel type field effect transistors (FETs). M1, M2 and M3 are the transistors concerning the operation of the memory cell, whereas M4 is a parasitic transistor which do involve in the operation of the memory cell. When thresholds of transistors M1–M4 are indicated by $V_{th1}$–$V_{th4}$, respectively, the following relationship therebetween holds such that $$V_{th1} \sim V_{th2} < V_{th3} \sim V_{th4}$$

where ~means "almost equal to".

Data of "0" or "1" is held in accordance with a quantity of a charge stored at a gate of M1, namely whether the charge of the gate of M1 and M4, that is the potential at B is low or high.

First, a case where "0" is written in the cell is considered. The potential of the bit line BL is held at a low potential level of $V_{BL}$ (L level). Thereafter, the potential of the word line WL is set to a high potential level of $V_{WH}$ so as to render M2 and M3 conductive. When "0" is previously written in M1, the potential of B is held low. On the other hand, when "1" is previously written in M1, the charge stored at M1 is pulled out to the bit line BL through M3 and M2 so as to be lost, so that the potential of the gate of M1 is decreased to $V_{BL}$ and then "0" is written.

Next, a case where "1" is written in the cell is considered. The potential of the bit line BL is held at the same level as the high potential $V_{DD}$ (H level) of the power line. Thereafter, the potential of the word line WL is set to the high potential level of $V_{WH}$ so as to render M2 and M3 conductive. When "0" is previously written, the potential of B, that is the potential of the gate in M1 is increased to $V_{DD}$ and then "1" is written. On the other hand, when "1" is previously written, the potential of the gate in M1 is held high.

There exists a case where the parasitic transistor M4 is rendered conductive when "0" is written to a cell having "1" therein. This will not affect on the operation of the memory cell. The reason therefor will be described herein.

Assume that the following relationship holds between the supply voltage VDD, and the threshold $V_{th4}$ of M4 and the bit line potential $V_{BL}$ when "0" is written, such that $$V_{DD} > V_{H4} + V_{BL} \quad (1)$$

If the above relationship holds and "0" is written into the cell storing "1", M4 operates as follows. Prior to writing data, data of "1" is stored, so that the potential of B is $V_{DD}$. Since "0" is written in, the potential for the bit line is $V_{BL}$. Then, since the potential of B is higher than that of the bit line plus $V_{th4}$, M4 is rendered conductive. Thereby, the charge stored at the gate of M1 is pulled out to the bit line through M4 and M2, so that potential of B is pulled out from $V_{DD}$. At the same time, M3 is rendered conductive by the potential $V_{WH}$ of the word line, and the charge stored at the gate of M1 is pulled out to the bit line through M3 and M2, so that the potential of B is pulled out from $V_{DD}$. In other words, M4 assists M3 in the course of writing "0" into the cell, and M4 does not interfere with the operation of the memory cell. When inequality (1) holds and "0" is written to the cell storing "1", M4 is not rendered conductive, thus causing no affect to the operation of the memory cell.

Next, there will be described a case for reading out the data. The potential for the bit line BL is precharged at $V_{BL}$ which is lower than $V_{DD}$, and the potential for the word line WL is set to the potential $V_{WL}$ such that Ms is rendered conductive but M3 is not rendered conductive. When the stored data is "0", M1 is not rendered conductive and the potential for the bit line BL remains unchanged since the potential for the gate of M1 is low. On the other hand, when the stored data is "1", M1 is rendered conductive and the bit line BL is connected to $V_{DD}$ so as to increase the potential since the potential for the gate of M1 is high. By a change of the potential for the bit line, the written data can be verified. Moreover, since M3 does not become conductive in a process of reading, the charge stored in the gate of M1 is not pulled out, so that the written data can not be lost.

Next, there is an occasion where the parasitic transistor M4 is activated in a process of reading out "1", however, this activation does not affect the operation of the memory cell, which will be described below.

Assume that there holds a relationship between the supply voltage $V_{DD}$ and the the threshold $V_{TH4}$ of M4, such that $$V_{DD} > V_{TH4} \quad (2)$$

When "1" is read out while the inequality (2) holds, M4 will operate as follows. When the potential for B is higher than that of the bit line plus $V_{TH4}$ in reading out data of "1", M4 is rendered conductive. Thereby, the charge stored at M1 is pulled out to the bit line through M4 and M2, so that the potential of B is pulled down from $V_{DD}$. However, the potential of B does not go below that of the bit line plus $V_{TH4}$. This is because if the potential of B becomes below that of the bit line plus $V_{TH4}$, M4 can not be rendered conductive. Accordingly, the potential of B is kept at the potential of B plus $V_{TH4}$.

As previously mentioned, the threshold $V_{TH1}$ of M1 is smaller than $V_{TH4}$ of M4. Thereby, since the potential of B is kept at that of bit line plus $V_{TH4}$, M1 is rendered conductive and $V_{DD}$ is connected to the bit line through M1 and M2 so as to increase the potential of the bit line, so that "1" can be read out.

If $V_{DD} \leq V_{TH4}$ holds, M4 does not become conductive in reading out "1".

When the potential of the word line WL is set to the potential such that M2 does not become conductive, the potential of B position does not change and the data written in the cell is stored if there is no leak current at all. However, in reality there exists the leak current such as a gate current of the transistor M1, so that the data written in the cell dissipates gradually. Therefore, it is necessary to write data again within a certain period of time in order to store the data.

Even though the parasitic transistor M4 may be rendered conductive when the data is read from and written to the memory cell, M4 does not influence the memory cell in terms of operation thereof, so that the circuit structure shown in FIG. 18 operates in the same manner with that shown in FIG. 8.

FIGS. 19a–19c and 20a–20c show cross sectional views to show a process sequence for producing the above memory cell according to the fifth embodiment.

With reference to 19a, a substrate protection thermal oxide 32 is formed uniformly on a p type silicon substrate 31. The thermal oxide 32 is patterned by a lithography process using a usual photoresist. Thereafter, trenches 33, 34 is formed by, for instance, the RIE technique.

Figure 19A:
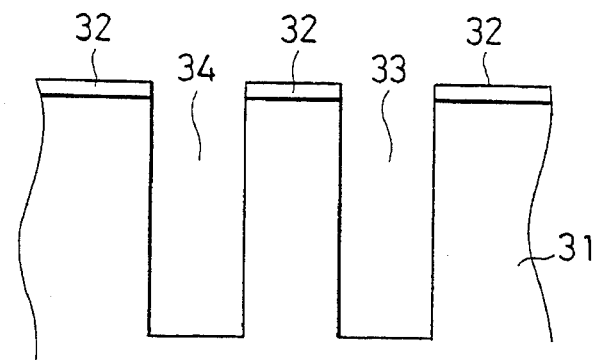
FIGS. 19a–19c and 20a–20c show cross sectional views to show a process sequence for producing the above memory cell according to the fifth embodiment.
Figure 19B:
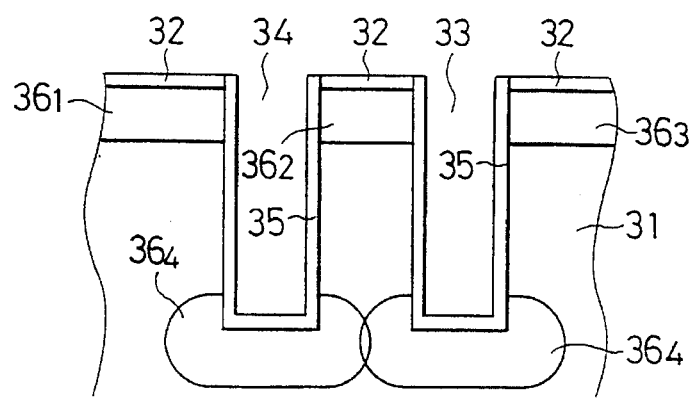

Next, with reference to FIG. 19b, a protection thermal oxide 35 is formed inside the trenches 33, 34. Then, an arsenic ion implantation is performed on the whole surface thereof, so that an n type impurity region 36 ($36_1$, $36_2$, $36_3$, $36_4$) is formed.

Figure 19C:
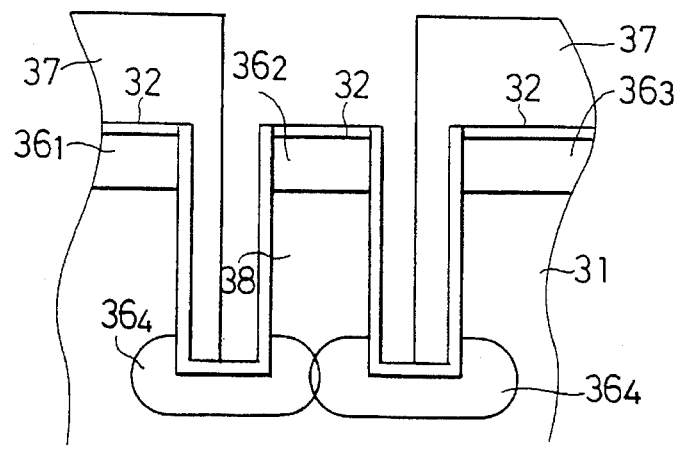

Next, with reference to FIG. 19c, the p type silicon substrate located between the trenches 33, 34 is exposed by a lithography process utilizing a photoresist 37 and a high energy ion implantation by arsenic is performed thereon. Thereby, an p type region 38 having a higher concentration than the the p type substrate therebelow is formed. This p type region 38 corresponds to M3, M4 shown in FIG. 18. By the p type region 38, the threshold of M3 and M4 are made higher than that of M1 and M2.

Figure 20A:
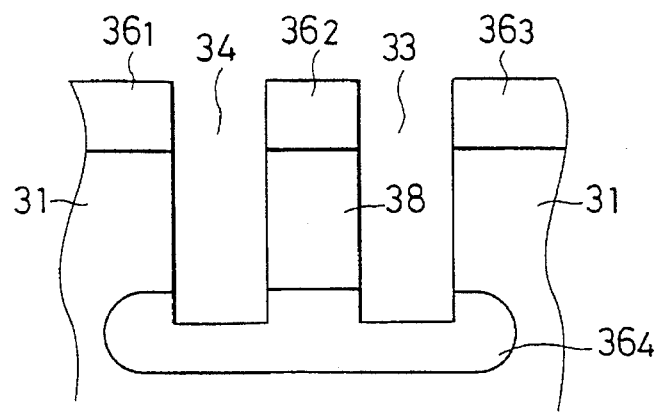

Next, with reference to FIG. 20a, the photoresist 37 is stripped and the thermal diffusion is carried out. Then, the oxide films 32, 35 are stripped. Here, the n type impurity region $36_4$ is made such that each n type impurity region disposed at a base of each first trench 33 and second trench 34 are mutually connected to each other in the base portion thereof.

Figure 20B:
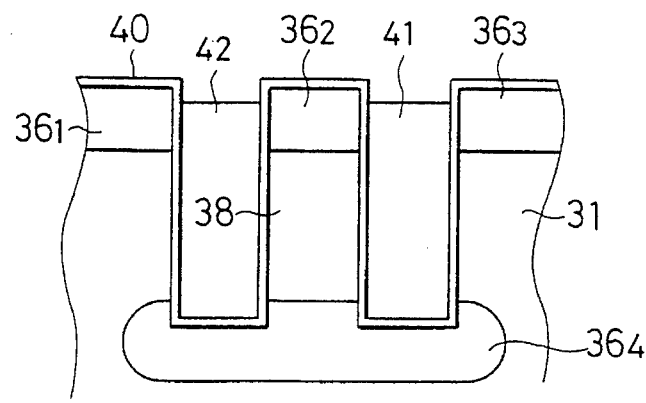

Next, with reference to FIG. 20b, after the thermal oxide 40 which will be the gate oxide film is formed, the polysilicon is deposited thereon and the phosphorus is diffused thereinto. Thereafter, the polysilicon formed at other region than the inside of the trenches 33, 34 is removed, so that there are formed gate electrodes 42 made from the polysilicon inside the trenches 33, 34.

Figure 20C:
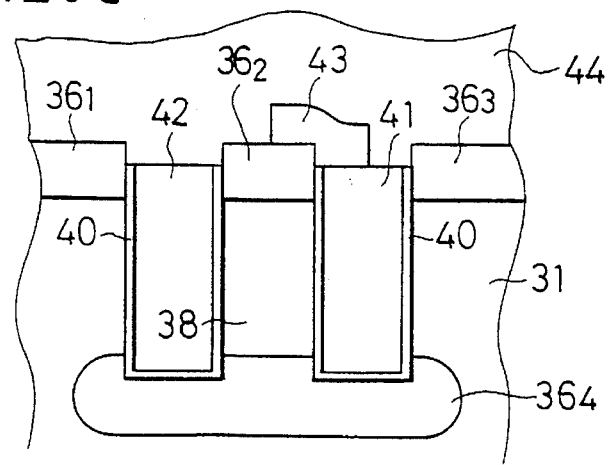

Next, with reference to FIG. 20c, there is formed an Al interconnection 43 in order to electrically connect the n region $36_2$ formed on the p type substrate surface between the trenches 33, 34 and the polysilicon 41 (serving as the gate electrode) filled in the trench 33. Thereafter, a protection oxide 44 is deposited thereon so as to realize a memory cell structure shown in FIG. 17.

Figure 21A:
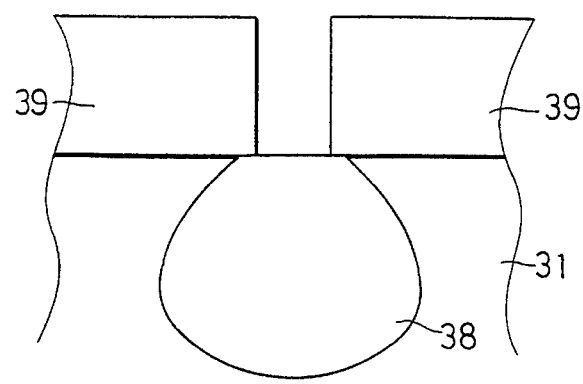
Figure 21B:
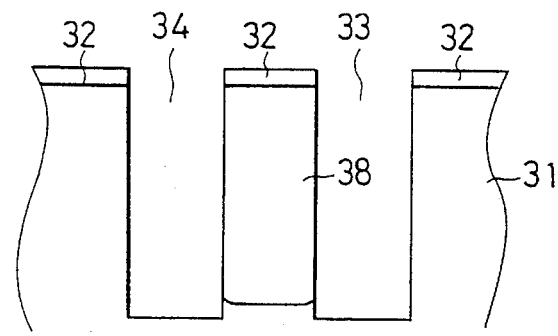

With reference to FIGS. 21a and 21b, there is shown another production method for a process up to FIG. 20a.

With reference to FIG. 21a, a resist 39 is formed on a p type silicon substrate 31. Then, ion implantation is performed using the resist as a mask, so that a highly concentrated p type region 38 is formed on a part of the surface of the substrate 31. Next, with reference to FIG. 21b, there are formed trenches 33, 34 in the substrate 31. Thereafter, a selective ion implantation of arsenic and a thermal diffusion are performed so as to obtain the profile shown in 20a.

In this process, since there is formed the highly concentrated p type region 38 prior to formation of the trenches, there is no longer needed a diagonal ion implantation or the like, so that the highly concentrated p type region 38 can be formed with ease and great reliability.

Figure 22A:
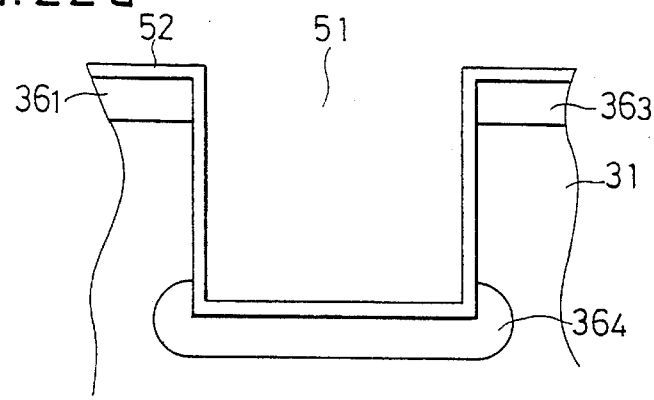
Figure 22B:
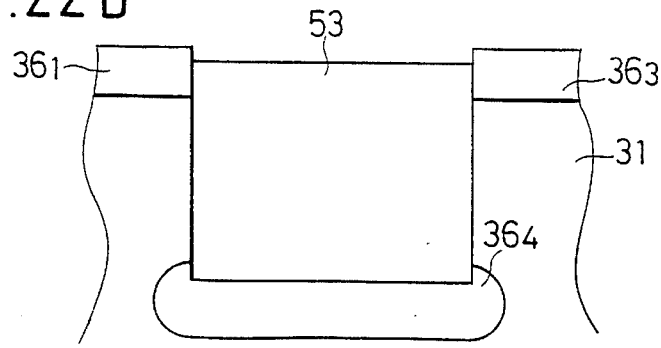

With reference to FIGS. 22a and 22b, there is shown still another production method for a process up to FIG. 20a.

First, with reference to FIG. 22a, there is formed a trench 51 on the surface of the p type silicon substrate 31 and there is formed a protection oxide 52 on the substrate 31. The arsenic is ion implanted so as to form an n type region 36. Next, with reference to FIG. 22b, after the oxide 52 is stripped, the trench 51 is filled with a polysilicon 53. Thereafter, the polysilicon 53 formed other than inside the trench 51 is removed. Thereafter, the trenches 33, 34 are formed and then there is formed the highly concentrated p type region 38 so as to realize the memory cell profile shown in FIG. 20a.

In this process shown in FIG. 22a and FIG. 22b, there is formed a large size trench 51 covering the trenches 33, 34 prior to the formation of the trenches 33, 34, so that the n type region 36 disposed just below the trench can be formed continuously with ease.

Figure 1:
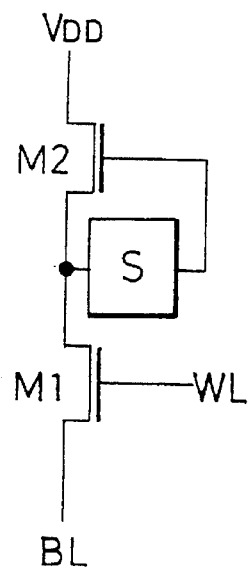
FIG. 1 shows a circuit diagram of a conventional DRAM.
Figure 2:
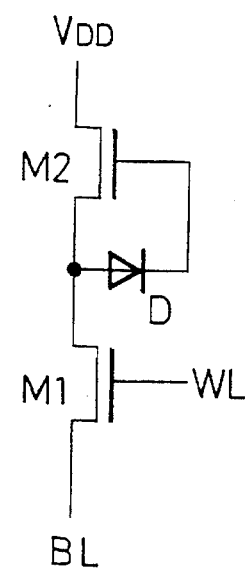
FIG. 2 shows an example where there is used a Schottky diode as the switching element S shown FIG. 1.
Figure 3:
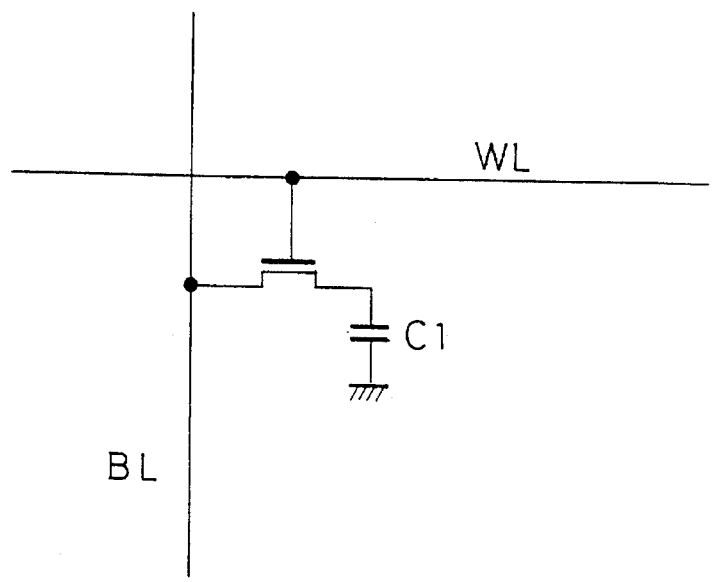
FIG. 3 shows another example of the conventional DRAM, including a transistor and a capacitor connected thereto.

According to the fifth embodiment, there can be realized the structure shown in FIG. 17 with the circuit configuration therefor shown in FIG. 18, so that the similar operation of reading and writing data as shown in FIG. 8. By implementing the fifth embodiment, the structure for the memory cell can be made simpler than that of FIG. 2 and is suitable for a further miniaturized device. Therefore, the production process therefor can be further simplified and is suitable for a mass production thereof.

Embodiment No. 6

Figure 23A:
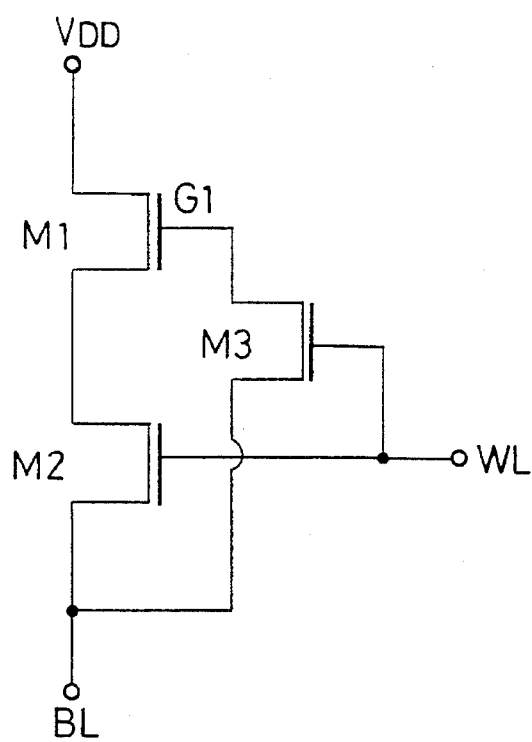
FIG. 23a and FIG. 23b shows equivalent circuits for DRAM memory cells according to the sixth embodiment.
Figure 23B:
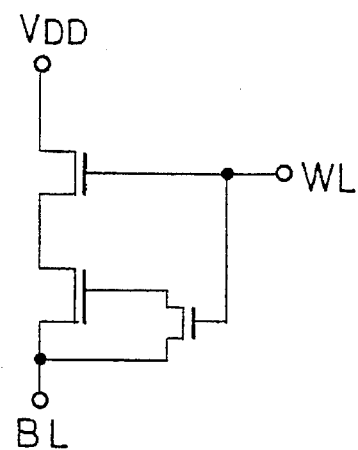

With reference to FIG. 23a and FIG. 23b, there are shown equivalent circuits for DRAM memory cells according to the sixth embodiment.

With reference to FIG. 23a, the first MOS transistor M1 and the second MOS transistor M2 are connected in series between the power line $V_{DD}$ and the bit line BL. The first MOS transistor M1 is a memory transistor having the gate G1 thereof as a storage node, and the second MOS transistor M2 is a transfer gate transistor. There is provided the third MOS transistor M3 between the gate G1 of M1 and the bit line BL. The gate of M2 and the gate of M3 are commonly connected to the word line WL.

The potential of the word line WL in selecting the cell is set to $V_{WLW}$ (high) at the time of reading data and set to $V_{WLR}$ (low) for writing data such that two high and low types of biases are set. When the potential of WL is $V_{WLW}$, M2 and M3 are rendered conductive, while when the potential of WL is $V_{WLR}$, M2 and M3 have a threshold voltage such that M2 becomes conductive and M3 does not become conductive.

Next, the operation of the memory cell shown in FIG> 23a will be described in detail.

Assume that three transistors M1, M2, M3 are all n channel type MOS transistors and the state of high potential corresponds to data "1". The potentials of bit line BL are defined to be $V_{BLL}$ and $V_{BLH}$ when "0" and "1" are written, respectively. When the threshold of the first transistor M1 is defined $V_{TH1}$ and M1 is rendered either conductive or nonconductive by the potential of G1 written from the bit line BL, the following relationship holds such that $$V_{BLL} < V_{TH1} < V_{BLH} \qquad (2)$$

Firstly, the operation of writing "0" is described. After the potential of the bit line BL is set to $V_{BLL}$, the potential of the word line WL is set to $V_{WLW}$ so as to render M3 conductive. Now that M3 is in the state of being conductive, the potential of gate G1 of M1 prior to writing data, is equal to $V_{BLL}$ regardless of data written. Thereafter, when the potential of word line WL is decreased so as to render M3 nonconductive, the potential of gate G1 is held at $V_{BLL}$ (if the leak current is ignored) and the operation of writing "0" is completed.

Secondly, the operation of writing "1" is described. After the potential of bit line BL is set to $V_{BLH}$, the potential of word line WL is set to $V_{WLW}$ so as to render M3 conductive. Now that M3 is in the state of being conductive, the potential of gate G1 is equal to $V_{BLH}$ regardless of the data written. Thereafter, the potential of word lime WL is reduced so as to render M3 nonconductive, the potential of gate G1 (if the leak current is ignored) is held at $V_{BLH}$ and the operation of writing "1" is completed.

Next, the operation of reading data is described. After the potential of bit line BL is precharged to a predetermined potential of $V_{BLP}$ so as to set bit line BL in the state of floating, potential $V_{WLR}$ of word line WL is set such that M2 is rendered conductive and M3 does not become conductive. When "0" is written in, the potential of gate G1 is $V_{BLL}$ just before the operation of data read. M3 remains nonconductive through the read operation, so that the potential of gate G1 remains unchanged. Thereby, M1 is in the state of being nonconductive, so that the potential of power line $V_{DD}$ is not transferred to bit line BL and the potential of bit line BL is hardly changed.

On the other hand, when "1" is written, the potential of gate G1 just before the operation of data read is $V_{BLH}$. In this case too, M3 is in the state of being nonconductive, so that the potential of gate G1 remains at $V_{BLH}$. Therefore, since M1 is in the state of being conductive, the potential of power line $V_{DD}$ is transferred to bit line BL through M1 and M2, so that the potential of bit line BL is increased. By detecting a change of the potential of bit line BL from $V_{BLP}$, verified is whether a stored data is "0" or "1".

Moreover, when the potential of word line WL is set to $V_{WLH}$ such that M3 is rendered conductive at the time of data write, M2 is rendered conductive as well. However, this will not affect the operation of data write.

FIG. 23b shows a modified version over the memory cell shown in FIG. 23a.

IN this modified memory cell shown in FIG. 23b, a wire for connecting to the bit line of transistor M3 does not intersect with the word line of transistor M2 compared to the memory cell shown in FIG>23a. As a result, the memory cell shown in FIG. 23b can be manufactured more easily.

The operation of the memory cells shown in FIG. 23a and FIG. 23b differs from the operation of the memory cell shown in FIG. 8 in that the data write is executed with one transistor (M3) while the data write is executed through two transistors (M2 and M3) in the third embodiment shown in FIG. 8. Therefore, the memory cell according to the sixth embodiment shown in FIGS. 23a and 23b can perform a faster data-writing than the third embodiment shown in FIG> 8.

In the above description on the data write, when transistor M3 becomes a nonconductive state, the potential of gate G1 of transistor M1 is stored on the condition that the leak current is ignored. In reality, there exists the leak current from M3, etc., so that the potential of gate G1 changes with time. Thereby, after the data is read out from the memory cell, the same data is written again within a predetermined period of time before the potential of gate G1 changes and the stored data disappears. By this so-called refresh operation, a memory device utilizing a memory cell according to the configuration shown in FIG. 23a and FIG. 23b. can be realized even in a case where the leak current can not be ignored.

Figure 24:
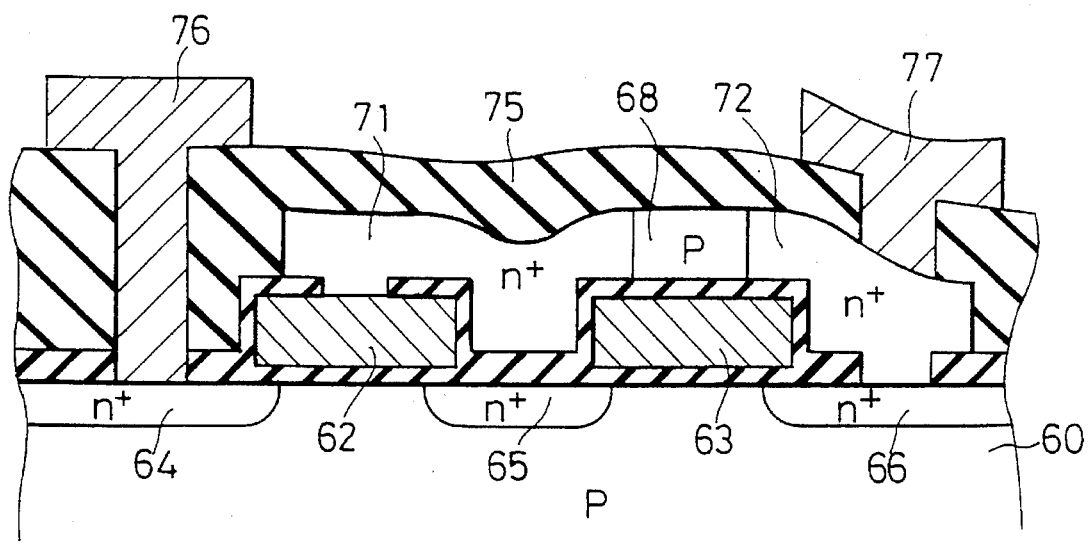

FIG. 24 shows a cross section of a device structure realizing the circuit shown in FIG. 23a. FIGS. 25a–25c and FIG. 26a–26c show a process sequence for producing the structure shown in FIG. 24.

With reference to FIG. 24, the first and second n channel MOS transistors M1, M2 comprising gate electrodes 62, 63 and n⁺ type diffusion layers 64, 65, 66 formed on the surface of the p type silicon substrate 60 are connected in series. On the transistors M1, M2, there are formed a p type semiconductor layer 68 through the insulator. On a part of the semiconductor layer 68, there are formed n+ type diffusion layers 71, 72. In other words, the diffusion layer 71 extending from an end of the gate electrode 62 to an end of the gate electrode 63 is electrically connected to the gate electrode 62, and the diffusion layer 72 extending from the other end of the gate electrode 63 to the surface of the substrate is electrically connected to the n⁺ type diffusion layer 66. Thereby, there is formed the third MOS transistor M3 in which the diffusion layers 71, 72 serve as a source and a drain, respectively, the p type semiconductor layer 68 as a channel region, and the gate electrode 83 as a gate.

An interlayer insulator 75 is formed on the substrate on which three transistors are formed. The, contact holes are formed on the interlayer insulator 75, so that interconnections 76, 77 are provided therein. The interconnection 76 connected to the n+ type diffusion layer 64 is connected to the power supply $V_{DD}$, the interconnection 77 connected to the p type diffusion layer 66 is connected to the bit line BL, and the gate electrode 63 is connected to the word line WL.

A process sequence for manufacturing the above device shown in FIG. 24 will be described in detail.

Figure 25A:
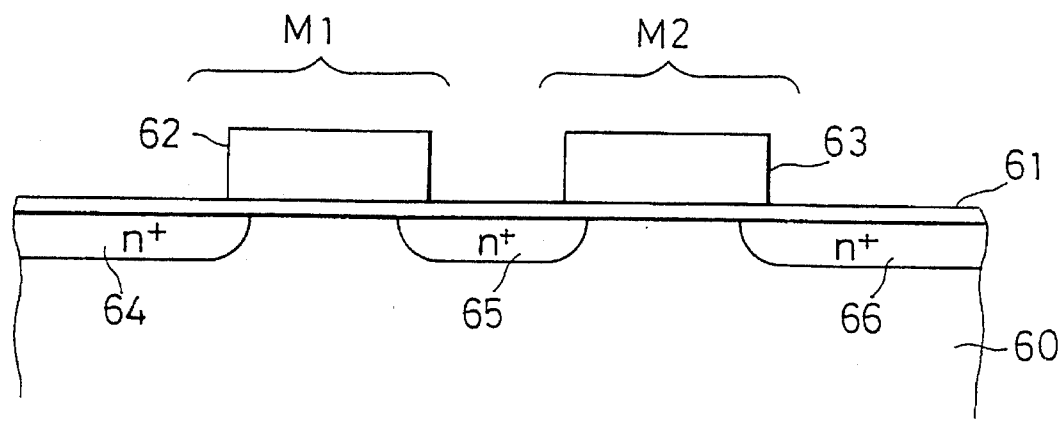
FIGS. 25a–25c and FIG. 26a–26c show a process sequence for producing the structure shown in FIG. 24.

With reference to FIG. 25a, there are formed the n channel MOS transistors M1, M2 comprising the gate oxide 61, the n type polysilicon gates 62, 63 and the n type diffusion layers 64, 65, 66, by the techniques of oxide formation, polysilicon deposition, arsenic diffusion, optical lithography, polysilicon silicon etching and ion implantation.

Figure 25B:
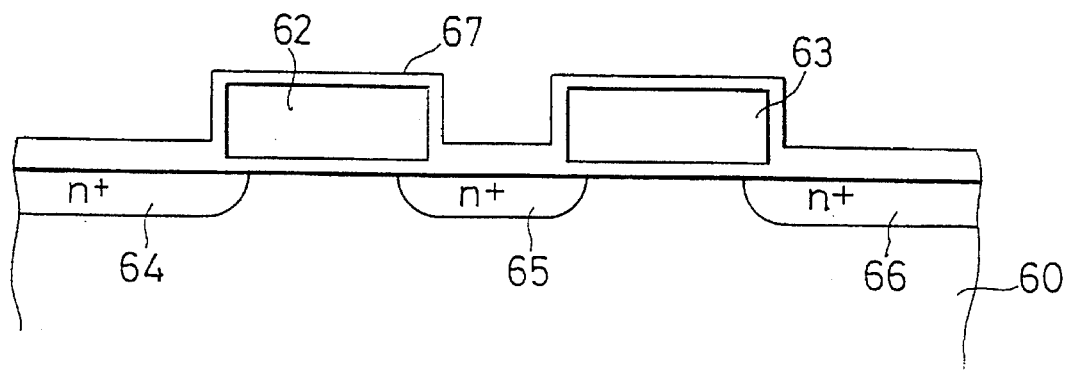

Next, with reference to FIG. 25b, an oxide 67 is formed on the surface of the n type polysilicon gates 62, 63 by a thermal oxidation. Then, the oxide 67 formed on the gate electrode 63 becomes a gate oxide of the third transistor M3.

Figure 25C:
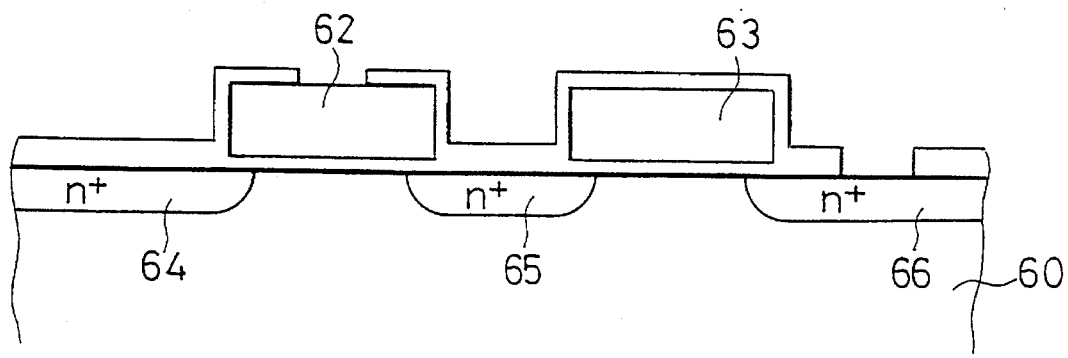

Next, with reference to FIG. 25c, a part of the oxide 67 on the polysilicon gate 62 and a part of the oxide 67 on the n+ type diffusion layer 66 are removed by the optical lithography and by etching the oxide 67.

Figure 26A:
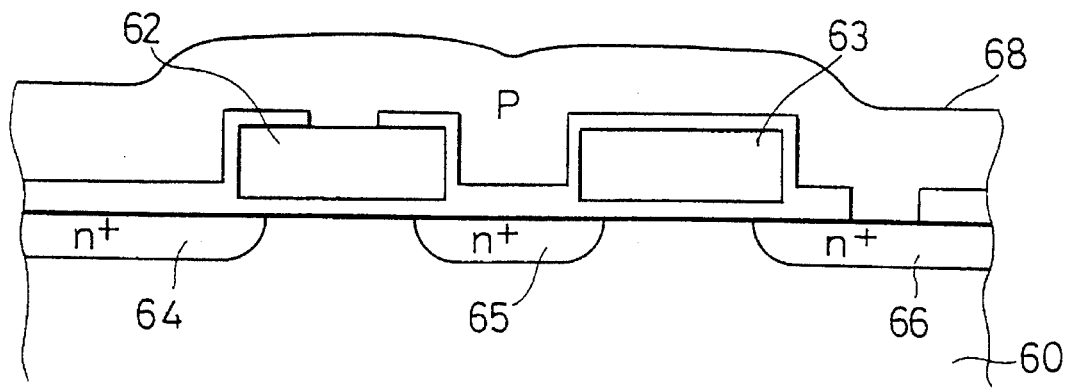
Figure 26B:
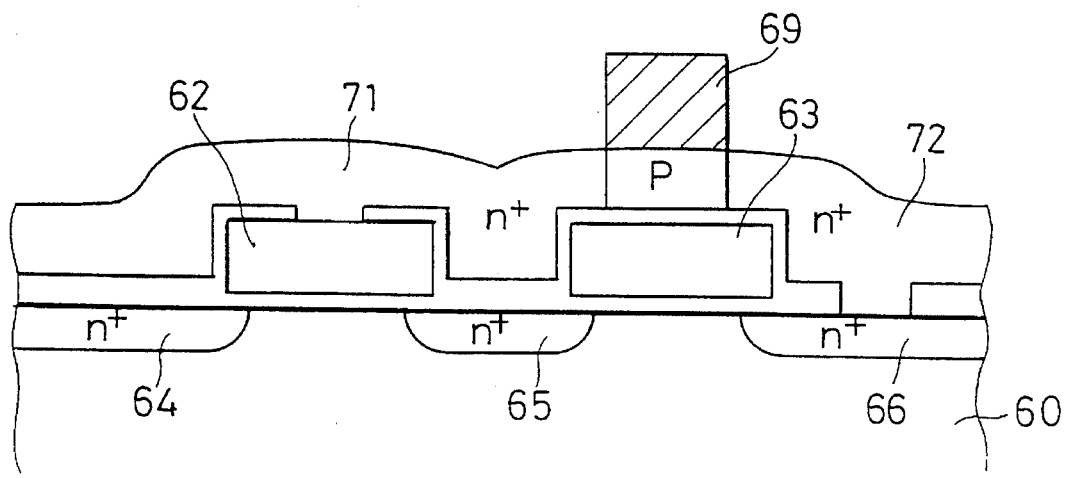

Next, with reference to FIG. 26a, after the polysilicon is deposited thereon, the arsenic is ion-implanted over the whole surface thereof so as to form the p type polysilicon film 68. Then, the ion implantation of the arsenic is adjusted such that the threshold voltage of M3 is greater than that of M2.

Figure 26C:
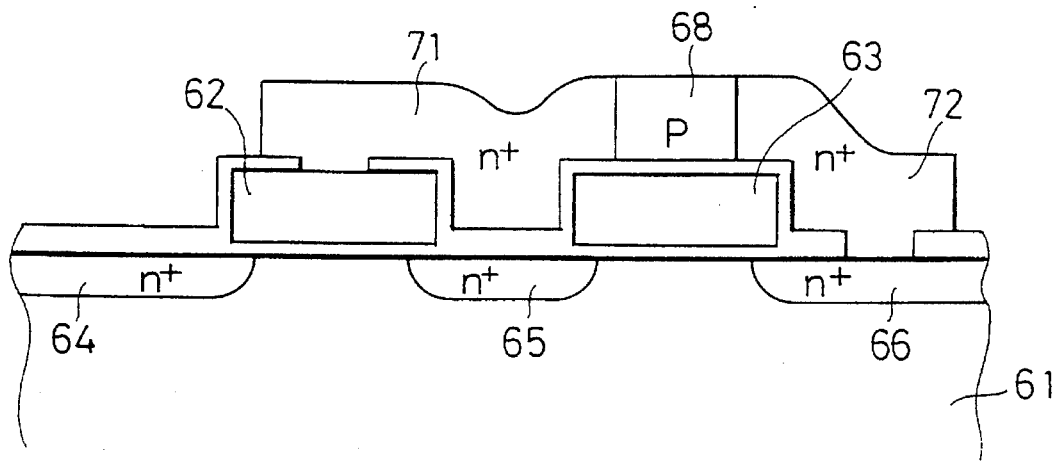

Thereafter, with reference to FIG. 26c, the arsenic is ion-implanted while a photoresist 69 patterned by the optical lithography is being used as a mask. As a result, a part of the polysilicon on the gate electrode 63 is removed so as to be of $n^+$ type, thus forming $n^+$ type regions 71, 72. Up to this point above for the process sequence, there is formed the n type MOS transistor M3 in which the $n^+$ type diffusion layers 71, 72 serve as the source and drain regions, respectively, the p type polysilicon 68 as the channel region, and the n type polysilicon 63 as the gate electrode.

Thereafter, with reference to FIG. 26c, after the photoresist 69 is removed, a part of the polysilicon is removed by the optical lithography and by etching the polysilicon. From this stage on, there can be obtained the transistor structure shown in FIG. 24 by forming a protection oxide 75 and the interconnections 76, 77. The polysilicon 63 which is a commonly shared gate electrode of M2 and M3 becomes the word line.

Accordingly, in the sixth embodiment, the data write is carried out by one MOS transistor alone, thus realizing a faster operation in the memory cell compared to the third embodiment shown in FIG. 8. Moreover, since all elements utilized here are MOS transistors alone, the sizes of all constituting elements can be proportionally reduced in ma process of integration thereof, thus being suitable for a highly integrated device.

Embodiment No. 7

Figure 27:
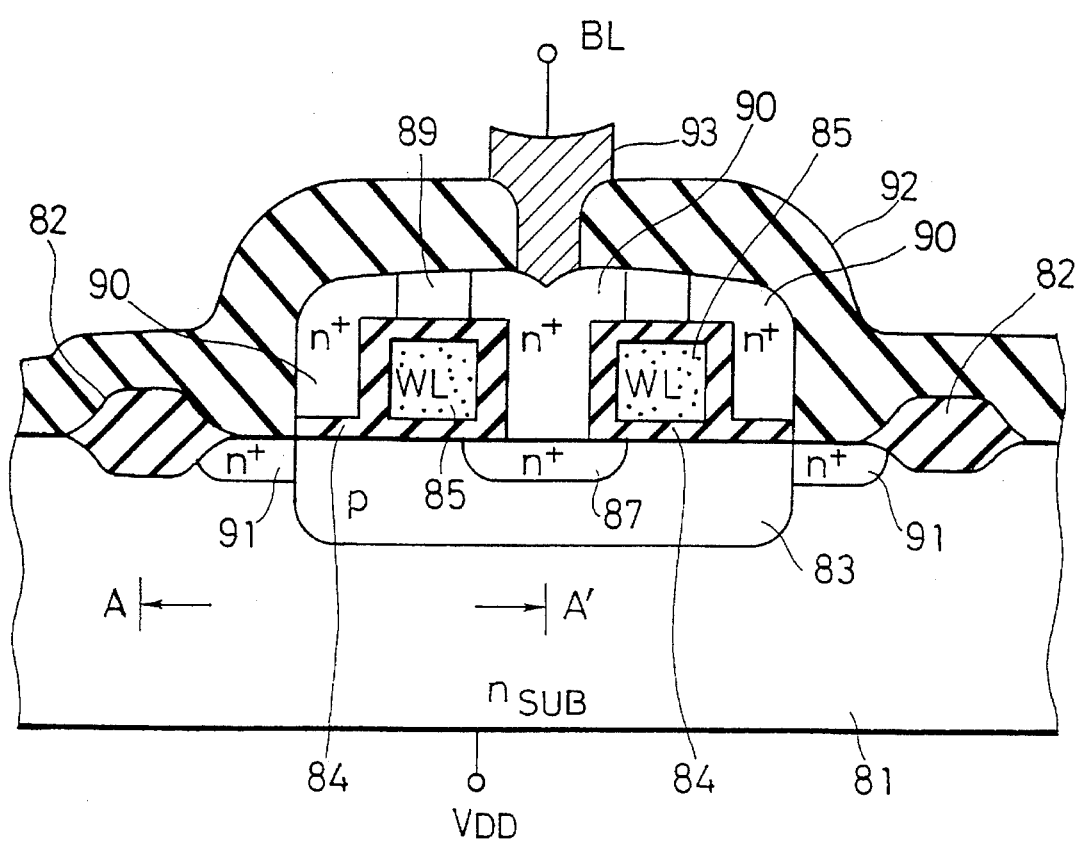
FIG. 27 shows a cross sectional device structure of a memory cell according to the seventh embodiment.

FIG. 27 shows a cross sectional device structure of a memory cell according to the seventh embodiment.

The device structure shown in FIG. 27 satisfies the circuit of FIG. 23a shown in the sixth embodiment.

With reference to FIG. 27, a p type well 83 is formed on an n type silicon substrate 81, and an $n^+$ type well 87 is formed inside the p type well 83. Adjacent to both ends of the p type well 83 there are formed $n^+$ type diffusion layers 91. There is formed a gate electrode 85 in a region extending from an end of an $n^+$ type well 87 toward the $n^+$ type diffusion layer 91. There is formed a p type semiconductor layer 89 covering a gate electrode 85, and a part of the p type semiconductor layer 89 is the $n^+$ type region which is electrically connected to the n+ type well 87. It is to be noted that the gate of M1 and the drain of the M3 are stacked together over the p type well region 83 which is disposed between the gate electrode 85 and the diffusion layer 91. Moreover, there is formed a protection insulator 92 over the substrate on which such the device is constructed. A contact hole is provided in the protection insulator 92, and an interconnection 93 is formed therein serving as the bit line BL.

FIGS. 28a–28c and FIGS. 29a–29c show cross sectional views of a process sequence for manufacturing the device structure shown in FIG. 27.

Figure 28A:
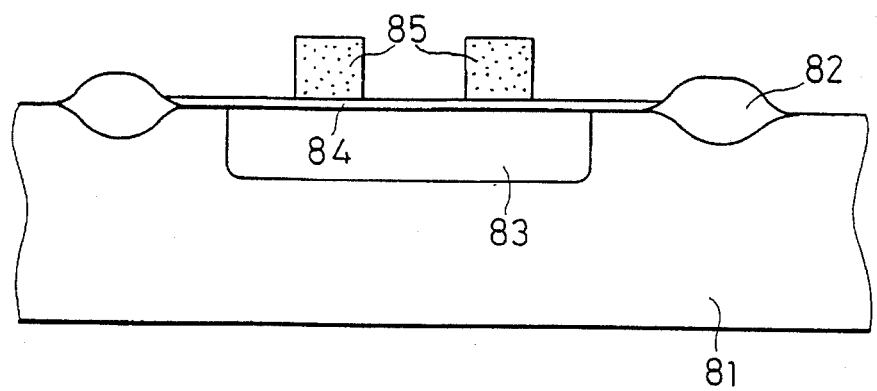
FIGS. 28a–28c and FIGS. 29a–29c show a cross sectional views of a process sequence for manufacturing the device structure shown in FIG. 27.

Firstly, with reference to FIG. 28a, a device isolation region 82 is formed on an n type silicon substrate 81 having an impurity concentration of $1\times10^{15}$ cm$^{-3}$ by a conventional method. Then, there is formed a first well region 83 of p type in the n type silicon substrate 81. Thereafter, the surface of the n type silicon substrate is oxidized so as to form a gate oxide 84 whose thickness is 10 nm. Then, there is formed an arsenic-added polysilicon film is deposited at thickness of 400 nm thereon. Then, a gate electrode 85 is formed by a photo lithography process and an etching technique.

Figure 28B:
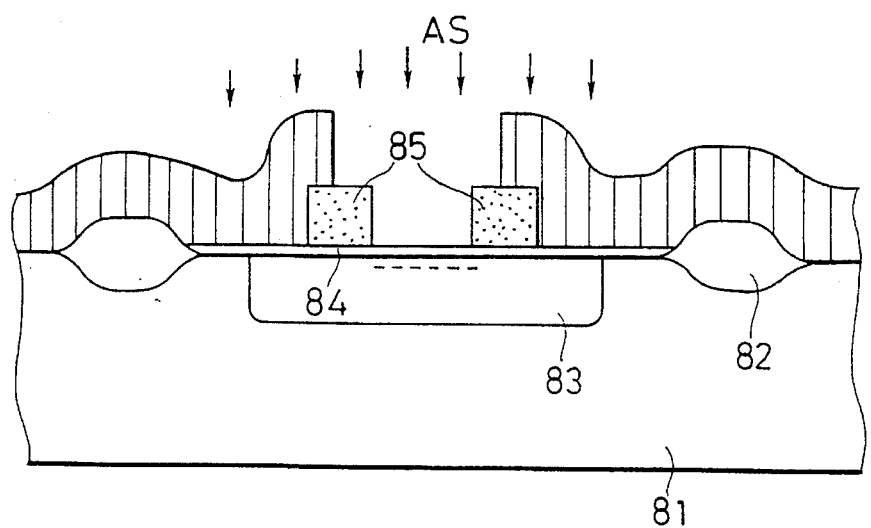

Next, with reference to FIG. 28b, after a resist pattern is formed such that a region that will become the second well region 87 is exposed, the $n^+$ type well 87 (the second well region 87) is formed by the ion implantation in which the acceleration voltage of the arsenic is 60 k eV and a dose thereof is $5\times10^{15}$ cm$^{-2}$.

Figure 28C:
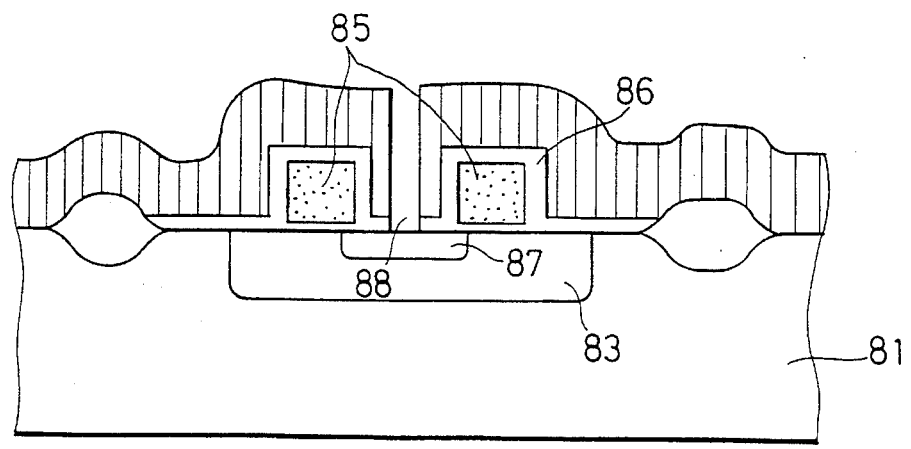

With reference to FIG. 28c, after the resist pattern is removed, there is formed a 20 nm thick silicon oxide 86 on the surface of the gate electrode 85 by the thermal oxidation. Then, a contact hole 88 for the second well 87 is formed by the photo lithography process and etching.

Figure 29A:
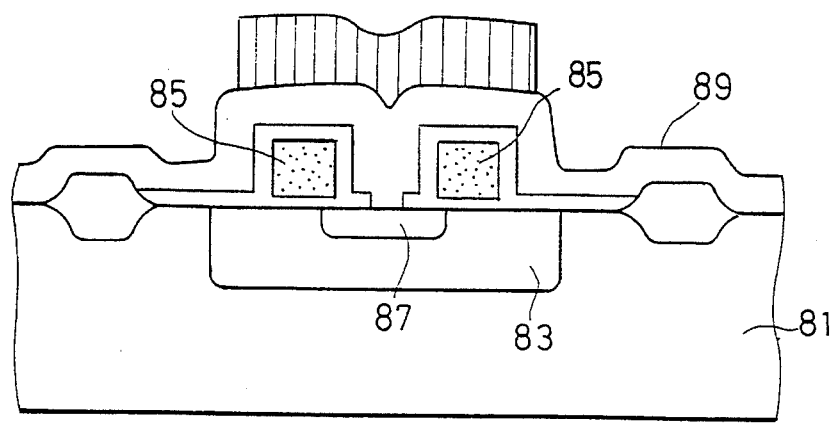

Next, with reference to FIG. 29a, after the resist is removed, the polysilicon 89 is deposited at thickness of 400 nm thereon by the CVD technique. Thereafter, the photo lithography process and etching process are performed such that the polysilicon 89 is left on the upper portion and the sidewall portion of the first gate 85, and on the region between the gates.

Figure 29B:
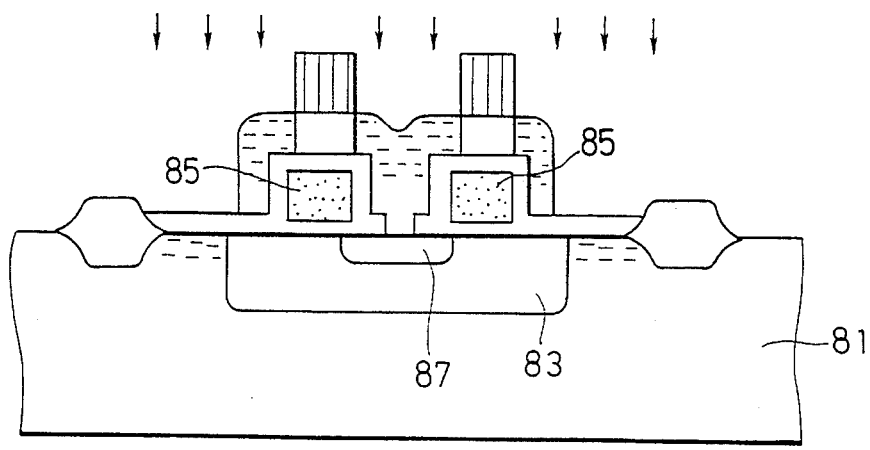

Next, with reference to FIG. 29b, there is formed a resist on the portion which will become a channel region of the polysilicon film 89. The arsenic is ion-implanted with 120 k eV and $5\times10^{15}$ cm$^{-2}$ while the resist is servings as a mask. As a result, by the thermal process there is formed an $n^+$ type region 91 having contact with the first well region 83 and the source/drain region 90 of the MOS transistor.

Figure 29C:
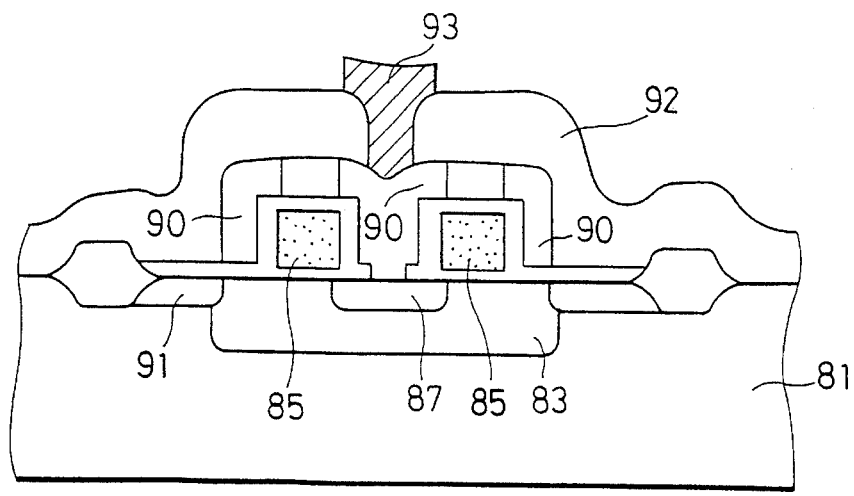

Next, with reference to FIG. 29c, an interlayer insulator 92 is formed thereon and there is formed an aluminum interconnection 93 serving as the bit line, by the conventional method. Thereafter, a passivation film is deposited thereon so as to complete the device shown in FIG. 27.

In the seventh embodiment, a complicated and difficult process such as a formation process in trench capacitors and stacked capacitors can be avoided. Besides, a DRAM cell with a minimum occupied area can be achieved, thus giving rise an effective means for highly integrated memory devices for the future use. In particular, there is no need to form a diffusion layer between the MOS transistors M1 and M2, and the MOS transistor M1 can be formed on the sidewall of the gate electrode thereof, so that the occupied area therefor can be significantly reduced. Moreover, the power supply $V_{DD}$ is supplied from the substrate, so that the diffusion layer for the power line and the contact hole can be omitted, thus improving an integration degree of the device.

In the above embodiments, there are described typical process sequences for each embodiment, however, there can be considered many other various ways to achieve the objective of the present invention. For example, as for the first transistor M1 having the first gate, though there is used the polysilicon transistor, there may be used a single-crystal silicon for further improving performance of the device. In that case, the single-crystal silicon may be grown from the bit-line-forming contact hole by a lateral epitaxial growth method or the like. Moreover, as for the power line $V_{DD}$, though $V_{DD}$ is directly connected from the silicon substrate, $V_{DD}$ may be connected through the contact hole in the above embodiments. Moreover, though there is used the n type substrate in the above embodiments, a p type substrate may be used so as to form an n type well.

In the above embodiments, the first transistor and the second trasistor may be interchangeably provided between the power line and the bit line. Moreover, the transistors utilized in these embodiments may be replaced with a MIS or MES type.

In summary, by implementing the present invention where the memory cell is constructed using three MOS transistors, there is realized the memory cell having the minimum occupied area therefor and the DRAM according to the present invention can achieve the highly integrated and further high-speed device. Furthermore, in the present invention utilizing the diode D, since the tunnel current flows through between the gate and source of the second MOSFET, a highly integrated and high-speed device can be realized. Moreover, since the diode having the ideal characteristics can be formed as depicted in this specifications, the reliability of write-in data and the controllability of write-in time can be significantly improved, thus reducing irregularity of the device.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. A dynamic random access memory (DRAM) cell equipped with a power supply line, a bit line and a word line therein, the memory cell comprising:

first transistor, having a gate, a source and a drain;

a second transistor, for storing an electric charge;

said second transistor having a first gate for erasing the charge stored at the second transistor, a second gate, a source and a drain; and a diode having first and second electrodes, wherein said drain of said first transistor is connected to said source of said second transistor and said first electrode of said diode;

said first and second gates are commonly connected to said second electrode of said diode;

said source of said first transistor, said gate of said first transistor and said drain of said second transistor are connected to said bit line, said word line, and said power supply line, respectively.

2. The memory cell of claim 1, wherein said first gate is configured at a source side of the second transistor.

3. The memory cell of claim 1, wherein said first gate includes a first gate insulator and a first gate electrode formed on the first gate insulator, and the second gate includes a second gate insulator whose thickness is thicker than the first gate insulator and a second gate electrode formed on the second gate insulator.

4. The memory cell of claim 1, wherein said first and second gates include barriers for a tunnel current, wherein the barrier height of said first gate is lower than that of said second gate.

5. The memory cell of claim 1, wherein the diode is a Schottky diode.

6. A dynamic random access memory (DRAM) cell equipped with a power source line, a bit line and a word line therein, the memory cell comprising:

a first transistor and a second transistor provided between the power line and the bit line in a manner that the first and second transistors are connected in series at a connecting node therebetween; and a third transistor provided between a gate of the first transistor and the connecting node, wherein a gate of the second transistor and a gate of the third transistor are commonly connected to the word line.

7. A dynamic random access memory (DRAM) cell equipped with a power supply line, a bit line and a word line therein, the DRAM cell comprising:

a first transistor and a second transistor provided between the power line and the bit line in a manner that the first and second transistors are connected in series; and a third transistor provided between a gate of the first transistor and the bit line, wherein a gate of the second transistor and a gate of the third transistor are commonly connected to the word line.

8. A dynamic random access memory (DRAM) cell equipped with a power source line, a bit line and a word line therein, the memory cell comprising:

a first transistor and a second transistor provided between the power line and the bit line in a manner that the first and second transistors are connected in series at a connecting node therebetween; and a third transistor provided between a gate of the second transistor and the connecting node, wherein a gate of the first transistor and a gate of the third transistor are commonly connected to the word line.

9. A dynamic random access memory (DRAM) cell equipped with a power supply line, a bit line and a word line therein, the DRAM cell comprising:

a first transistor and a second transistor provided between the power line and the bit line in a manner that the first and second transistors are connected in series; and a third transistor provided between a gate of the second transistor and the bit line, wherein a gate of the first transistor and a gate of the third transistor are commonly connected to the word line.

10. The memory cell of claims 6, 7, 8 or 9, wherein a threshold voltage of the second transistor is smaller than that of the third transistor in terms of an absolute value thereof.

11. The memory cell of claim 6, 7, 8, or 9, further comprising a fourth transistor whose gate is commonly connected to a gate of the first transistor, whose source is connected to a drain of the first transistor and whose drain is connected to a source of the third transistor.

12. The memory cell of claims 1, 6, 7, 8 or 9, wherein the transistors are of MOS, MIS or MES type.

13. The memory cell of claims 6, 7, 8 or 9, wherein there is formed a trench on a substrate, there are formed the first and second transistors on sidewalls of the trench, there is formed the third transistor on a semiconductor film filled in the trench, and the memory cell is characterized in that a gate of the second transistor is formed on the semiconductor film filled in the trench, and the gate 15 of the second transistor simultaneously serves as a gate of the third transistor.

14. The memory cell of claims 6, 7, 8 or 9, wherein:

there are formed first and second trenches, interposing a thin insulating film therebetween, which acts as a gate insulator for said third transistor;

and the memory cell is characterized in that the gate insulator of the first transistor is formed on the sidewall of the first trench, and the gate insulator of the second transistor is formed on the sidewall of the second trench.

15. The memory cell of claims 6, 7, 8 or 9, wherein there are formed the first and second transistors on a substrate; and there is formed the third transistor formed on a semiconductor film deposited over a region extending over both the first and second transistors, a channel region of the third transistor being formed adjacent a gate of the second transistor.

16. The memory cell of claim 15, wherein the semiconductor film on which there is formed the third transistor simultaneously serves as a gate of the first transistor.

* * * * *